(12) United States Patent
Noda

(10) Patent No.: US 8,563,933 B2
(45) Date of Patent: Oct. 22, 2013

(54) THERMAL DETECTOR, THERMAL DETECTOR DEVICE, ELECTRONIC INSTRUMENT, AND METHOD OF MANUFACTURING THERMAL DETECTOR

(75) Inventor: Takafumi Noda, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 372 days.

(21) Appl. No.: 13/013,124

(22) Filed: Jan. 25, 2011

(65) Prior Publication Data

US 2011/0180713 A1    Jul. 28, 2011

(30) Foreign Application Priority Data

Jan. 26, 2010    (JP) .................................. 2010-014085

(51) Int. Cl.
    *G01J 5/20*    (2006.01)
(52) U.S. Cl.
    USPC ...................................................... 250/338.4
(58) Field of Classification Search
    USPC ...................................................... 250/338.4
    See application file for complete search history.

(56) References Cited

U.S. PATENT DOCUMENTS

| | | | |
|---|---|---|---|
| 6,495,829 B1 | 12/2002 | Oda | |
| 7,075,081 B2 * | 7/2006 | Fiorini et al. | 250/338.4 |
| 7,812,385 B2 | 10/2010 | Noda | |
| 2002/0009821 A1 * | 1/2002 | Moor et al. | 438/48 |
| 2007/0089670 A1 * | 4/2007 | Ikedo | 118/50 |
| 2007/0134817 A1 | 6/2007 | Noda | |
| 2008/0303074 A1 | 12/2008 | Noda | |
| 2009/0068763 A1 | 3/2009 | Noda | |
| 2009/0072287 A1 | 3/2009 | Noda | |
| 2009/0127604 A1 | 5/2009 | Noda | |
| 2009/0137065 A1 | 5/2009 | Noda et al. | |

FOREIGN PATENT DOCUMENTS

| | | |
|---|---|---|
| JP | 08-285680 A | 11/1996 |
| JP | 2000-205944 A | 7/2000 |
| JP | 2002-214038 A | 7/2002 |
| JP | 2006-194894 A | 7/2006 |
| JP | 2007-150025 A | 6/2007 |
| JP | 2008-218782 A | 9/2008 |
| JP | 2009-065089 A | 3/2009 |
| JP | 2009-071022 A | 4/2009 |
| JP | 2009-071241 A | 4/2009 |
| JP | 2009-071242 A | 4/2009 |
| JP | 2009-124017 A | 6/2009 |
| JP | 2009-129972 A | 6/2009 |
| JP | 2009-130188 A | 6/2009 |
| JP | 2009-141179 A | 6/2009 |

* cited by examiner

*Primary Examiner* — David Porta
*Assistant Examiner* — Kenneth J Malkowski
(74) *Attorney, Agent, or Firm* — Global IP Counselors, LLP

(57) ABSTRACT

The thermal detector includes a support member supported on a substrate. The support member has a mounting portion supporting a thermal detector element, and at least one arm portion connected at one end to the mounting portion and connected at the other end to the substrate. At least one of the mounting portion and the at least one arm portion has a first member disposed towards the substrate, a transverse width of a transverse cross-sectional shape of the first member set to a first width; a second member disposed toward the thermal detector element and facing the first member, a transverse width of the second member set to the first width; and a third member linking the first member and the second member, a transverse width of the third member set to a second width that is smaller than the first width.

18 Claims, 14 Drawing Sheets

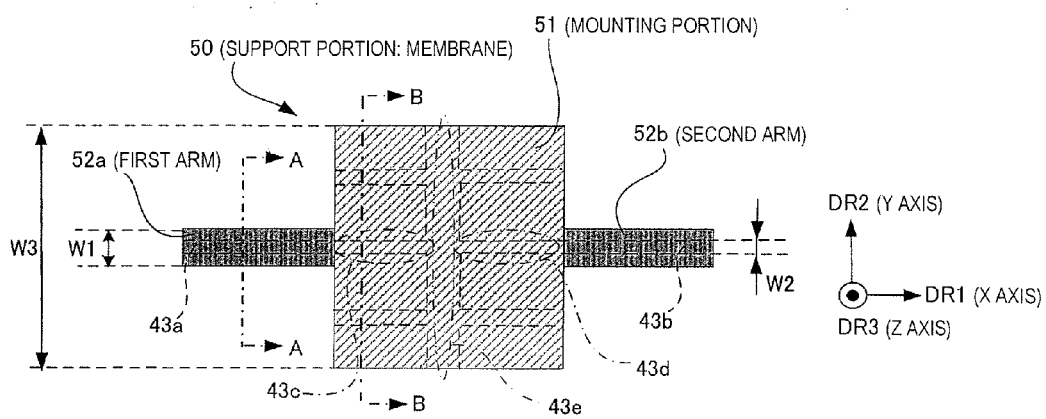
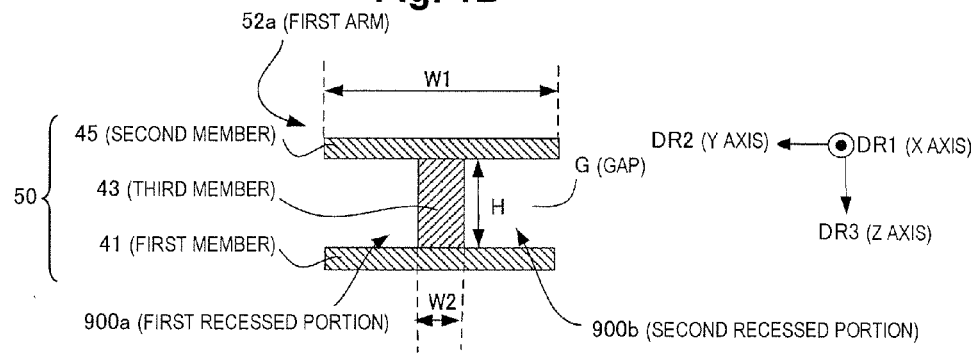
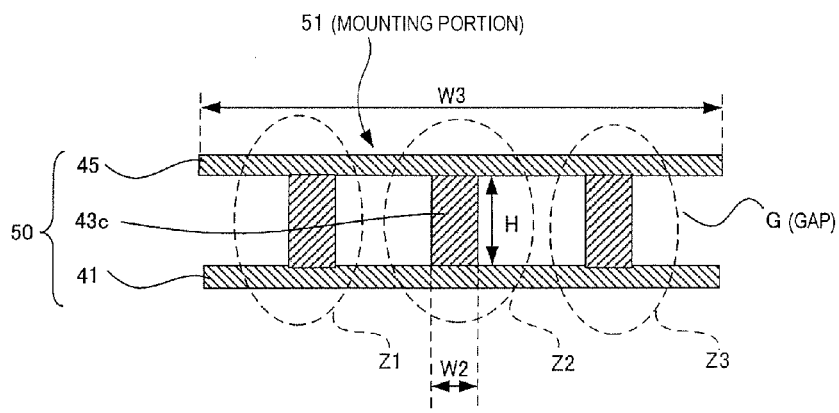

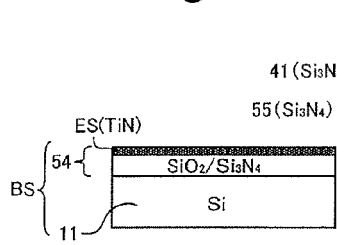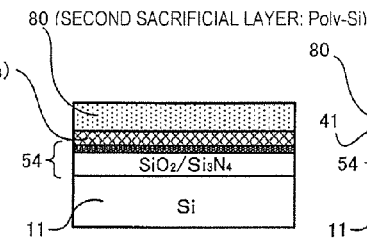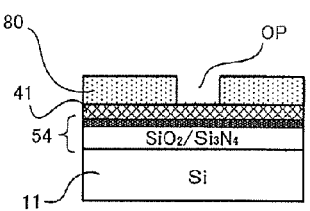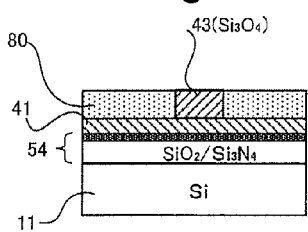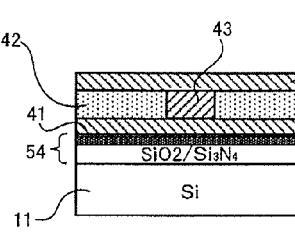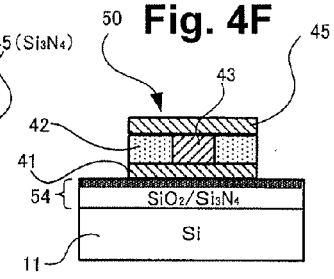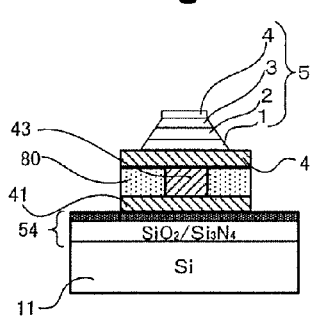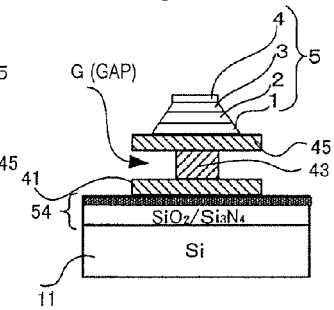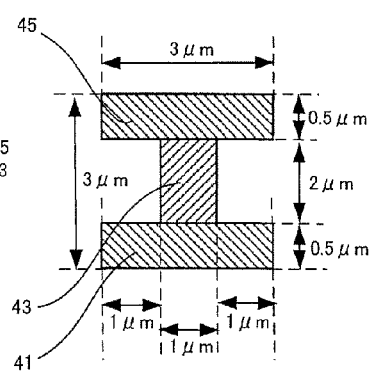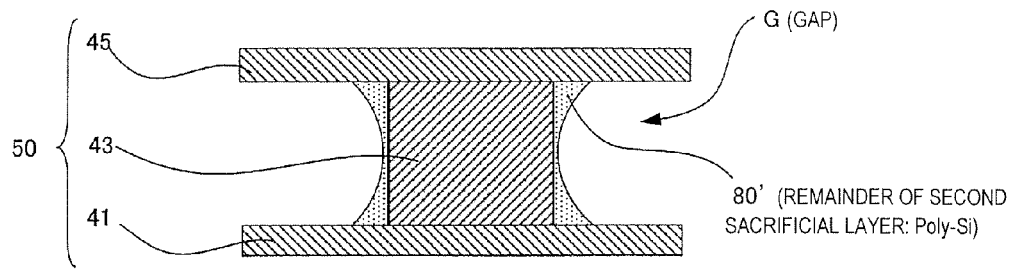

Fig. 6A
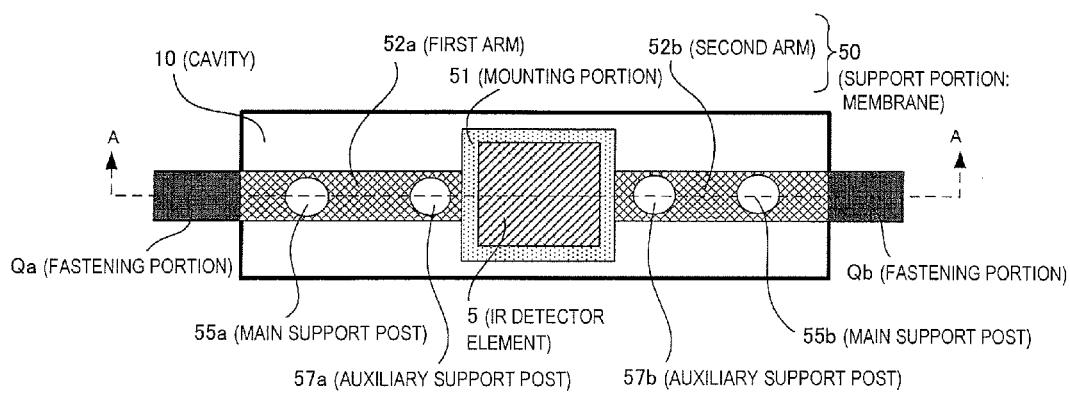
Fig. 6B
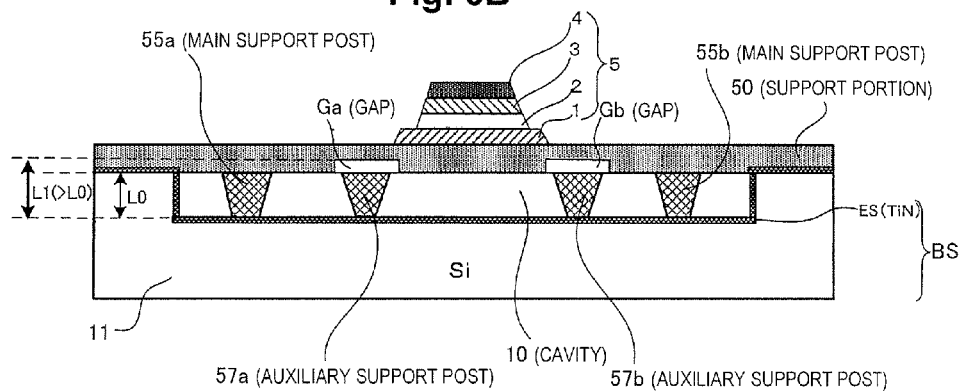
Fig. 6C   Fig. 6D   Fig. 6E
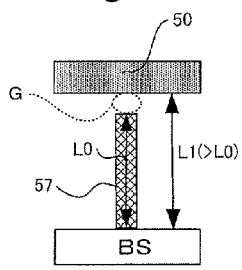 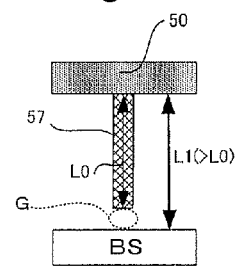 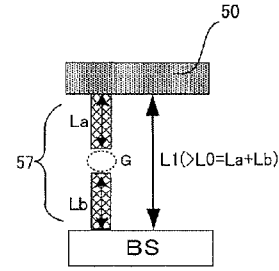

THERMAL DETECTOR, THERMAL DETECTOR DEVICE, ELECTRONIC INSTRUMENT, AND METHOD OF MANUFACTURING THERMAL DETECTOR

CROSS-REFERENCE TO RELATED APPLICATIONS

This application claims priority to Japanese Patent Application No. 2010-014085 filed on Jan. 26, 2010. The entire disclosure of Japanese Patent Application No. 2010-014085 is hereby incorporated herein by reference.

BACKGROUND

1. Technical Field

The present invention relates to a thermal detector, to a thermal detector device, to an electronic instrument, and to a method of manufacturing a thermal detector device.

2. Related Art

In the field of thermal detectors, elements such as thermopiles, pyroelectric elements, and bolometers are known. A thermopile uses thermocouples to directly detect a rise in temperature in a light absorbing film in association with absorption of light.

A pyroelectric element utilizes the pyroelectric effect of a ferromagnetic body to detect a temperature rise in a light absorbing film in association with absorption of light. For example, ferroelectric PZT (lead zirconate titanate), lithium tantalate, and other such crystals with a high dielectric constant give rise to changes in the level of electrical polarization when heated or cooled. Specifically, spontaneous changes in the level of polarization arise when the temperature changes, producing changes in the level of surface charge; whereas in the absence of temperature change, the surface charge is neutralized. In association with changes in polarization conditions, pyroelectric current flow is produced due to changes in the amount of surface charge between electrodes connected to both ends of the ferroelectric crystal. By detecting this pyroelectric current, the quantity of irradiating light (infrared or the like) can be sensed.

A bolometer detects temperature rise associated with light absorption, in the form of changes in resistance of a thermosensitive resistance element, for example.

Typically, a thermal detector has a structure that lacks a cooling system. Consequently, it is necessary to have a structure whereby the element is housed in a hermetic package or otherwise situated in a reduced pressure environment, while providing thermal separation from the substrate and neighboring film to prevent as much as possible the diffusion of heat produced by received light (infrared or the like) to the surrounding area. One effective way to prevent dissipation of heat to the substrate and avoid diminished detection characteristics of a thermal detector is to employ a structure in which, for example, a cavity for thermal separation is provided between the substrate and the thermal detector element (see Japanese Laid-Open Patent Application 2000-205944 and Japanese Laid-Open Patent Application 2002-214038 for example). Japanese Laid-Open Patent Application 2000-205944 discloses a thermal type infrared array sensor having a cavity for thermal separation, and Japanese Laid-Open Patent Application 2002-214038 discloses a pyroelectric type infrared detector element having a cavity for thermal separation.

Also, examples in which an arm portion in a support member that supports the element has a U-shaped cross section or the like for enhanced support strength are disclosed in Patent Japanese Laid-Open Patent Application 2006-194894 and Japanese Laid-Open Patent Application 8-285680 for example. In Japanese Laid-Open Patent Application 2006-194894, the cross-sectional shape of the arm is limited to a "U shape, L shape, or T shape". In Japanese Laid-Open Patent Application 8-285680, the cross section shape of the arm is limited to a "U shape or L shape".

Additionally, infrared detector elements, which are one type of thermal detector element, are employed in the field of small scale elements as personal sensors for example, and in the field of large scale arrays as infrared camera devices for example. While initially developed as military technologies, in recent years application in consumer products is progressing, and various applications for infrared detection may be anticipated in the future.

SUMMARY

In order to prevent dissipation of heat to the substrate and avoid diminished detection characteristics of a thermal detector, it is effective to reduce the thermal capacity of the arm portion in the support member that supports the element. For example, giving the arm portion a smaller cross-sectional area reduces the thermal capacity of the support member. However, by simply giving the arm portion a smaller cross-sectional area (e.g., by simply reducing the thickness of the material layers that make up the arm portion), adequate strength of the arm portion may not be assured.

According to at least one aspect of the present invention, reduced thermal capacity and ample mechanical strength of a support member may both be attained in a thermal detector, for example.

(The thermal detector according to a first aspect of the present invention includes: a substrate; a thermal detector element including a light absorbing film; and a support member supported on the substrate and adapted to support the thermal detector element; wherein the support member has a mounting portion for mounting the thermal detector element, and at least one arm portion connected at one end to the mounting portion and connected at another end to the substrate; and at least one of a first arm included in the at least one arm portion and the mounting portion has a first member disposed toward the substrate, a transverse width of a transverse cross-sectional shape of the first member set to a first width; a second member disposed toward the thermal detector element and facing the first member, a transverse width of a transverse cross-sectional shape of the second member set to the first width; and a third member linking the first member and the second member, at least one height of a transverse cross-sectional shape of the third member set to a prescribed height, and a transverse width of the transverse cross-sectional shape set to a second width that is smaller than the first width.

At least one of the mounting portion (element mounting portion) and arm portion that make up the support member is composed of a first member, a second member, and a third member, and because the third member has reduced volume, thermal capacity and heat conductance can be lower. Specifically, the support member is at least partially composed of the first member and the second member disposed in mutual opposition, and the third member linking the first member and the second member. The transverse width of the transverse cross-sectional shape of the third member (the second width) is smaller than transverse width of the transverse cross-sectional shape of the first member and the second member (the first width in both cases). The volume of the third member is smaller by the equivalent of the capacity of a space corresponding to the differential of the first width and the second width, and thus thermal capacity and heat conductance of the support member are reduced.

In the thermal detector according to another aspect of the present invention, the transverse cross-section of a three-dimensional structure composed of the first member, the second member, and one of the third members is an H-type cross section.

The three-dimensional structure composed of the first member, the second member, and one of the third members may be an H-type structure (a structure in which the first member and the second member are linked by the third member which is orthogonal to the two) for example. By so doing, the mechanical strength required of the support member may be assured. Specifically, by adopting as the structure for the support member a three-dimensional structure having an H-type cross section (or H-shaped cross section) of the type employed in assembly of building materials, ample mechanical strength of the support member in the longitudinal and transverse directions may be reasonably assured.

In the thermal detector according to another aspect of the present invention, the at least one arm portion has the first arm linked at one end thereof to one end of the mounting portion and supported at another end thereof on the substrate; a second arm linked at one end thereof to another end of the mounting portion and supported at another end thereof on the substrate, and having the same direction of extension as the first arm, each of the first arm, the second arm, and the mounting portion including the first member, the second member, and the third member; and the third member in the mounting portion has a first section conjoined to the third member in the first arm and extending in a first direction coincident with the direction of extension of the first arm, a second section conjoined to the third member in the second arm and extending in the first direction coincident with the direction of extension of the second arm, and a third section connected to each of the first section and the second section and extending in a second direction which is a direction perpendicular to the first direction.

Because the mounting portion is the member intended to receive mounting of the thermal detector element, the surface area thereof in plan view is larger than that of the arm portion. According to the present aspect, the third member in the mounting portion is given a shape in plan view that is a cross shape. This cross shape may be provided at multiple locations. By so doing, the wide second member (member on the element side) can be supported in stable fashion in the mounting portion.

That is, the third member in the mounting portion, seen in plan view, has for example a first section conjoined to the first arm and extending in a first direction coincident with the direction of extension of the first arm, a second section conjoined to the second arm and extending in a first direction coincident with the direction of extension of the second arm, and a third section connected to the first section and the second section, and extending in a second direction which is a direction perpendicular to the first direction. The first section and the second section correspond to the horizontal beam of the cross shape, and the third section corresponds to the vertical beam of the cross shape.

By so doing the wide second member can be supported in stable fashion in the mounting portion, despite the smaller volume of the third member.

The thermal detector according to another aspect of the present invention further includes at least one auxiliary support post that protrudes from either the substrate or the support member towards the other, and the total protruding length of the at least one auxiliary support post is smaller than the maximum distance between the substrate and the support member.

According to the present aspect, in addition to a structure designed to reduce the thermal capacity of the support member, discussed earlier, supporting support posts are utilized to reduce flexion of the support member and avoid problems such as sticking during the manufacturing process. Where the support member is made thinner in order to reduce the thermal capacity, during the manufacturing process if, for example, wet etching is used to form the cavity for thermal separation purposes, there arises a susceptibility to sticking (adhesion (bonding) between the substrate and the support member). Sticking can arise, for example, from surface tension of the liquid during the drying process subsequent to wet etching.

In order to avoid sticking, it is preferable to provide auxiliary support posts for stable support of the support member during the manufacturing process; however, where auxiliary support posts are simply provided, these will function as pathways for heat transmission, and therefore thermal capacity and heat conductance will increase.

Accordingly, during manufacture, it is preferable to support the support member with the auxiliary support posts until steps that could pose problems have been completed, and to then separate the auxiliary support posts from the support member so as to prevent escape of heat. For example, where the total projecting length of the auxiliary support posts is designated L0 and the maximum distance between the substrate and the support member is designated L1 (L1>L0), a sacrificial layer is formed in the section corresponding to the differential of L1 and L0. Then, once steps that could pose problems have been completed, by removing the sacrificial layer the auxiliary support posts and the support member can be separated.

In the thermal detector according to another aspect of the present invention, the thermal detector element is an infrared detector element.

According to the present aspect, an infrared detector element with low thermal capacity (i.e., high thermal sensitivity) and low heat conductance may be obtained. Moreover, the infrared detector elements may be manufactured with high yield (i.e. with negligible occurrence of problems such as sticking during the manufacturing process).

In the thermal detector device according to another aspect of the present invention, a plurality of any of the thermal detectors described above are disposed in a two-dimensional arrangement.

By so doing, there may be realized a thermal detector device (thermal type photo array sensor) furnished with a plurality of thermal detectors (thermal detector elements) in a two-dimensional arrangement (for example, arranged in an array along each of two orthogonal axes).

The electronic instrument according to another aspect of the present invention comprises any of the aforementioned thermal detectors.

Each of the thermal detectors described above has high sensitivity to heat owing to its small thermal capacity, and moreover may be manufactured at high yield, making it possible to reduce manufacturing costs. An electronic instrument furnished with such a thermal detector affords comparable advantages. For example, employing these thermal detectors as sensors equivalent to one cell or to several cells, it is possible to build electronic instruments of various kinds, such as analytical systems (measurement systems) for analyzing (measuring) physical information of objects, security systems for detecting fire or heat, FA (factory automation) systems for factories, and the like.

The electronic instrument according to another aspect of the present invention comprises the thermal detector device.

The thermal detector device described above has high sensitivity to heat owing to its small thermal capacity, and moreover may be manufactured at high yields, making it possible to reduce manufacturing costs. An electronic instrument furnished with this thermal detector device affords comparable advantages. Appropriate examples of electronic instruments include for example thermography systems for outputting images of light (temperature) distribution, or vehicle-mounted night vision or monitoring cameras.

The method of manufacturing a thermal detector device according to another aspect of the present invention provides a method for manufacturing a thermal detector device having a substrate; a thermal detector element including a light absorbing film; and a support member supported on the substrate and adapted to support the thermal detector element; the support member having a mounting portion for mounting the thermal detector element, and at least one arm portion connected at one end to the mounting portion and connected at another end to the substrate; at least one of a first arm included in the at least one arm portion and the mounting portion having a first member disposed toward the substrate, a transverse width of a transverse cross-sectional shape of the first member set to a first width; a second member disposed toward the thermal detector element and facing the first member, a transverse width of a transverse cross-sectional shape of the second member set to the first width; and a third member linking the first member and the second member, at least one height of a transverse cross-sectional shape of the third member set to a prescribed height, and a transverse width of the transverse cross-sectional shape set to a second width that is smaller than the first width; wherein the method comprises: a step for forming a first sacrificial layer on the substrate so as to fill a space for defining a cavity between the substrate and the support member; a step for forming on the first sacrificial layer the support member having the first member, the second member, the third member, and a second sacrificial layer made of material different from a material constituting the first sacrificial layer and disposed so as to fill a space contiguous with the third member and corresponding to a difference of the first width and the second width; a step for forming the thermal detector element on the support member; a step of removing the first sacrificial layer; and a step of removing the second sacrificial layer.

According to the present aspect, a first sacrificial layer for defining a cavity between the substrate and the support member is utilized, and a second sacrificial layer for defining a third member (one of the constituent elements of the support member) of reduced volume is used. The first sacrificial layer and the second sacrificial layer are composed of different materials.

The first sacrificial layer is formed over the substrate so as to fill a space for defining a cavity. The second sacrificial layer is disposed so as to fill a space contiguous with the third member, and corresponding to the difference of the first width and the second width. A cavity for thermal separation purposes is formed by removing the first sacrificial layer. A third member of reduced volume is formed by removing the second sacrificial layer.

The method for manufacturing a thermal detector device according to another aspect of the present invention comprises having the thermal detector further include at least one auxiliary support post protruding from either the substrate or the support member towards the other; a step for forming an auxiliary support post layer as a first auxiliary support post when the at least one auxiliary support post is to include the first auxiliary support post; and a step for forming a third sacrificial layer, which is conjoined with the first auxiliary support post layer, is made of a material different from a material constituting each of the auxiliary support post layer and the first sacrificial layer, is made of the same material as the second sacrificial layer, and has a thickness set such that a total projection length equal to the sum of the projection length of the first auxiliary support post layer and a projection length equivalent to the thickness of the first sacrificial layer becomes a maximum distance between the substrate and the support member.

The present aspect further includes a step of forming an auxiliary support post, and a step of separating the auxiliary support post from the support member. A third sacrificial layer for producing a gap is disposed between the auxiliary support post and the support member. A material identical to that used for the second sacrificial layer may be used as the material for the third sacrificial layer.

Specifically, a third sacrificial layer contiguous to the auxiliary support posts is formed (where the third sacrificial layer is patterned into posts, these may be termed sacrificial support posts or sacrificial spacers). Where the support member is to be formed over the second sacrificial layer, the support member can be stably supported by the auxiliary support posts and the third sacrificial layer (sacrificial support posts), and the mechanical strength of the support member may be substantially improved thereby.

For example, after the support member has been formed (e.g., after at least a portion of the thermal detector element has been formed), the first sacrificial layer is selectively removed, thereby forming a cavity for thermal separation purposes. At this time, because the support member is supported on the substrate (the sensor base) by the auxiliary support posts and the sacrificial layer (the sacrificial support posts), displacement and deformation are minimized, and even when the first sacrificial layer is removed by wet etching, the occurrence of sticking (the phenomenon of bonding of the substrate and part of the support member due to surface tension of the liquid) is minimized.

When the third sacrificial layer is subsequently removed, gaps form between the auxiliary support posts and the support member. By placing the thermal detector in the reduced pressure environment of a hermetically sealed package, for example, the heat separation function of the gaps is enhanced. Formation of the gaps has the effect of interrupting the heat dissipation path via the auxiliary support posts. Thus, the presence of the auxiliary support posts has no effect on the thermal capacity or heat conductance of the support member.

According to at least one aspect of the present invention as set forth above, it is thus possible to both reduce the thermal capacity and ensure the mechanical strength of the support member in a thermal detector, for example.

BRIEF DESCRIPTION OF THE DRAWINGS

Referring now to the attached drawings which form a part of this original disclosure:

FIG. 1A to FIG. 1C are drawings illustrating the planar shape and the cross-sectional structure of a support member (membrane) in a thermal detector;

FIG. 4A to FIG. 4I are drawings illustrating an example of a specific method of manufacturing a thermal detector;

FIG. 5 is a drawing showing a modified example of a transverse cross-sectional shape of a support member;

FIG. 6A to FIG. 6E are drawings illustrating a configuration of an example of a thermal detector (here, a pyroelectric type infrared detector) having auxiliary support posts;

DETAILED DESCRIPTION OF EXEMPLARY EMBODIMENTS

Figure 2A:
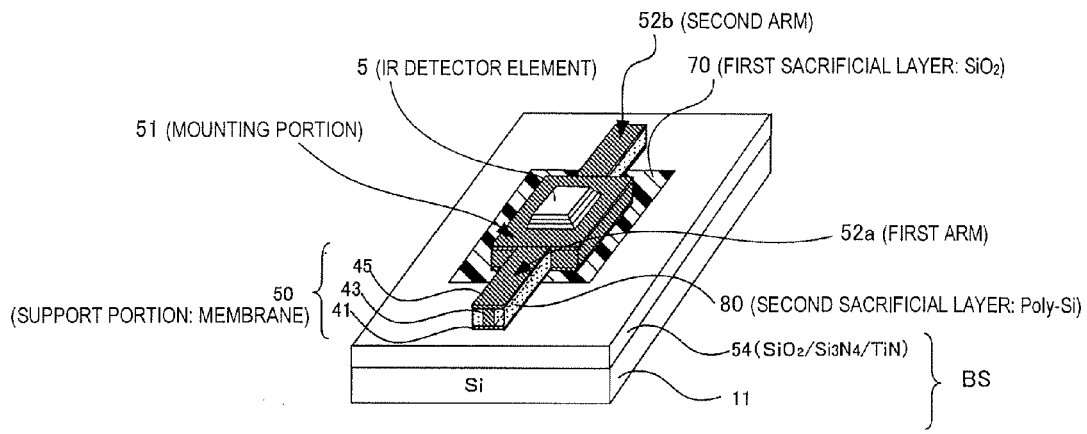
FIG. 2A to FIG. 2C are drawings illustrating an overview of an example of a method of manufacturing a thermal detector.

The preferred embodiments of the present invention are described in detail below. The embodiments described hereinbelow should not be understood as unduly limiting the scope of the invention disclosed in the appended claims, and it will be appreciated that not all elements of the configurations described in the embodiments are essential as means for solving the problems according to the present invention.

First Embodiment

The description turns first to the planar shape and to the three-dimensional structure of the transverse cross-section of a support member.

Planar Shape and Three-Dimensional Structure of Transverse Cross-Section of Support Member FIG. 1A to FIG. 1C are drawings illustrating the planar shape and the cross-sectional structure of a support member (membrane) in a thermal detector. FIG. 1A is a drawing showing the shape (in partial perspective view) of a support member (membrane) in a thermal detector; FIG. 1B is a cross-sectional view along line A-A (transverse cross-section of first arm); and FIG. 1C is a cross-sectional view along line B-B (transverse cross-section of mounting portion).

The support member (membrane) 50 is formed, for example, through superposition of a plurality of films, and has a shape in transverse cross-section that is a three-dimensional structure. This support member 50 supports a thermal detector element (not shown in FIG. 1) above a cavity for thermal separation (not shown in FIG. 1).

As shown in FIG. 1A, the support member (membrane) 50 has a mounting portion 51 for mounting the thermal detector element, and one or more arm portions 52 (52a, 52b) linked at one end to the mounting portion 51, and supported at the other end on the substrate. In FIG. 1A, the substrate that supports the arm portions 52 is not shown. The substrate is a base serving as a foundation for a sensor, and may be interpreted in a broad sense. Specifically, various types of films and layers (such as interlayer insulating films, interlayer insulating layers, conductor films, conductor layers, and the like) formed on a substrate narrowly defined may be considered as part of the substrate (substrate broadly defined).

The one or more arm portions 52 have a first arm 52a linked at one end thereof to one end of the mounting portion 51 and supported at the other end thereof at one side of the substrate (the left side in the drawing), and a second arm 52b linked at one end thereof to the other end of the mounting portion 51 and supported at the other end thereof at the other side of the substrate (the right side in the drawing), and having the same extension direction as the first arm.

As shown in FIGS. 1B and 1C, at least one of the mounting portion 51 and the first arm 52a/second arm 52b (in the example of FIG. 1, both the mounting portion 51 and the first arm 52a/second arm 52b) have an H shape in transverse cross-section (H-type cross section). Specifically, the three-dimensional structure of the transverse cross-section of at least one of the first arm 52a and the second arm 52b is an H-type structure (H-shaped structure).

This H-type structure has a first member 41 and a second member 45 disposed facing one another, and a third member 43 linking the first member and the second member. The first member 41 is disposed towards the substrate (i.e., to the lower side) whereas the second member 45 is disposed towards the thermal detector element (i.e., to the upper side). The third member 43 may also be viewed as a member for supporting the second member 45. The third member 43 supports the second member 45 at the center. The height of the third member is H.

While the constituent material of the first member 41, the second member 45, and the third member 43 is not particularly critical, all of these members may be composed of a silicon nitride film ($Si_3N_4$ film), for example.

The first member 41 is disposed parallel to an XY plane that is defined by an axis lying along a first direction DR1 (e.g., the X axis) and an axis lying along a second direction DR2 (e.g., the Y axis). Likewise, the second member 45 is parallel to an XY plane, but the first member 41 and the second member 45 are separated by a distance H.

As shown in FIG. 1B, with regard to the three-dimensional structure of the transverse cross-section of the first arm 52a, the transverse width of the shape of the transverse cross-section of the first member 41 is denoted as W1, and likewise the transverse width of the shape of the transverse cross-section of the second member 45 is denoted as W1. Meanwhile, the transverse width of the shape of the transverse cross-section of the third member 43 is denoted as W2 (W2<W1). A gap G is formed to either side of the third member 43, and the volume of the third member 43 is reduced by the equivalent of the volume of the space of the gaps G. The gaps G respectively provided at either side of the third member 43 may be viewed as a first recessed portion 900a and a second recessed portion 900b. Where W1 denotes a first width and W2 denotes a second width, there exists the relationship: first width W1>second width W2.

As shown in FIG. 1C, with regard to the three-dimensional structure of the transverse cross-section of the mounting portion 51, the transverse width of the shape of the transverse cross-section of the first member 41 is denoted as W3, and likewise the transverse width of the shape of the transverse cross-section of the second member 45 is denoted as W3. Meanwhile, the transverse width of the shape of the transverse cross-section of the third member 43 is denoted as W2 (W2<W3).

The third member 43 in the mounting portion 51 has a shape resembling a fishbone in plan view, as shown by the broken lines in FIG. 1A. In association therewith, with regard to the three-dimensional structure of the transverse cross-section of the mounting portion 51, there are formed a plurality of gaps G as depicted in FIG. 1C. The volume of the third member 43 is reduced by the equivalent of the volume of the space of the gaps G. Where W3 denotes a first width and W2 denotes a second width, there is defined the relationship: first width W3>second width W2. In FIG. 1C, H-type structures are employed at three locations (at each of the locations Z1-Z3 shown encircled by broken lines).

In this way, the volume of the third member 43 is reduced by the equivalent of the volume of the space (the gaps G) corresponding to the differential of a first width (W1 or W3) and a second width (W2), and thus the thermal capacity of the support member 50 as a whole is reduced; also, the cross-sectional area is reduced, making it difficult for heat to escape, and therefore heat conductance is reduced as well.

By adopting, for example, an H-type structure (a structure in which the first member 41 and the second member 45 are linked by the third member 43 orthogonal to both of these) as the three-dimensional structure, a level of mechanical strength required of the three-dimensional structure may be assured. Specifically, by adopting an H-type structure (or H-shaped structure) of the type employed in assembly of building materials, ample mechanical strength of the support member 50 in the longitudinal and transverse directions may be reasonably assured.

With an H-type structure, when weight is applied to the support member 50 from above (i.e., the element side), for example, the third member 43 bears this weight as well, and thus mechanical strength in the longitudinal direction is high. Also, because the H-type structure has excellent lateral balance, displacement of the various portions when weight is applied to the support member 50 in the transverse direction (the extension direction of the arm portions 52) is minimized, providing stability in the transverse direction as well.

As shown in FIG. 1A, because the mounting portion 51 is a member adapted for mounting of a thermal detector element, the surface area thereof in plan view is larger than that of the arm portions. In order to stably support the mounting portion 51, in the example of FIG. 1A, the shape in plan view of the third member 43 in the mounting portion 51 is a shape having a cross shape, and the wide second member 45 in the mounting portion 51 is supported stably by this cross shape (cross shapes may be disposed at a plurality of locations).

As shown in FIG. 1A, the third member 43 in the mounting portion 51 has a shape resembling a fishbone in plan view, with cross shapes employed at three locations. For example, in FIG. 1A, the third member 43 has a first section 43a and a second section 43b encircled by single-dot and dash lines, and a third section 43d encircled by a double-dot and dash line.

Specifically, seen in plan view, the third member 43 in the mounting portion 51 has a first section 43c that conjoins with the first arm 52a and extends in a first direction DR1 coincident with the extension direction of the first arm 52a; a second section 43d that conjoins with the second arm 52b and extends in the first direction DR1 coincident with the extension direction of the second arm 52b; and a third section 43e that connects to the first section 43c and the second section 43d, and extends in a second direction DR2 which is a direction perpendicular to the first direction DR1. The first section 43c and the second section 43d correspond to the horizontal beam section of the cross shape, and the third section 43e corresponds to the vertical beam section of the cross shape.

With this arrangement, notwithstanding the reduced volume of the third member 43 (i.e., the fishbone shape of the third member 43), the wide second member 45 in the mounting portion 51 may be provided with stable support (see FIG. 1C).

In this way, by using the three-dimensional structure of the support member depicted in FIG. 1A to FIG. 1C, reduced thermal capacity and ample mechanical strength of the support member 50 may both be attained in a thermal detector.

Overview of Method of Manufacturing Thermal Detector

Figure 2B:
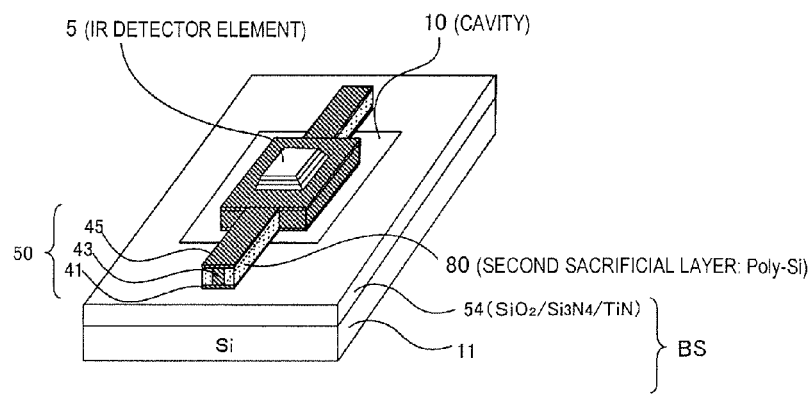
Figure 2C:
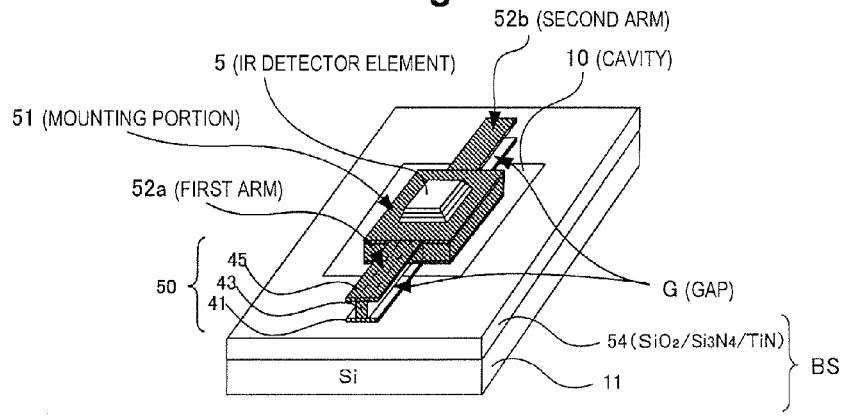

FIG. 2A to FIG. 2C are drawings illustrating an overview of an example of a method of manufacturing a thermal detector. In the example of FIG. 2, processing to reduce the volume of the third member 43 is carried out only in the arm portions 52.

Figure 12:
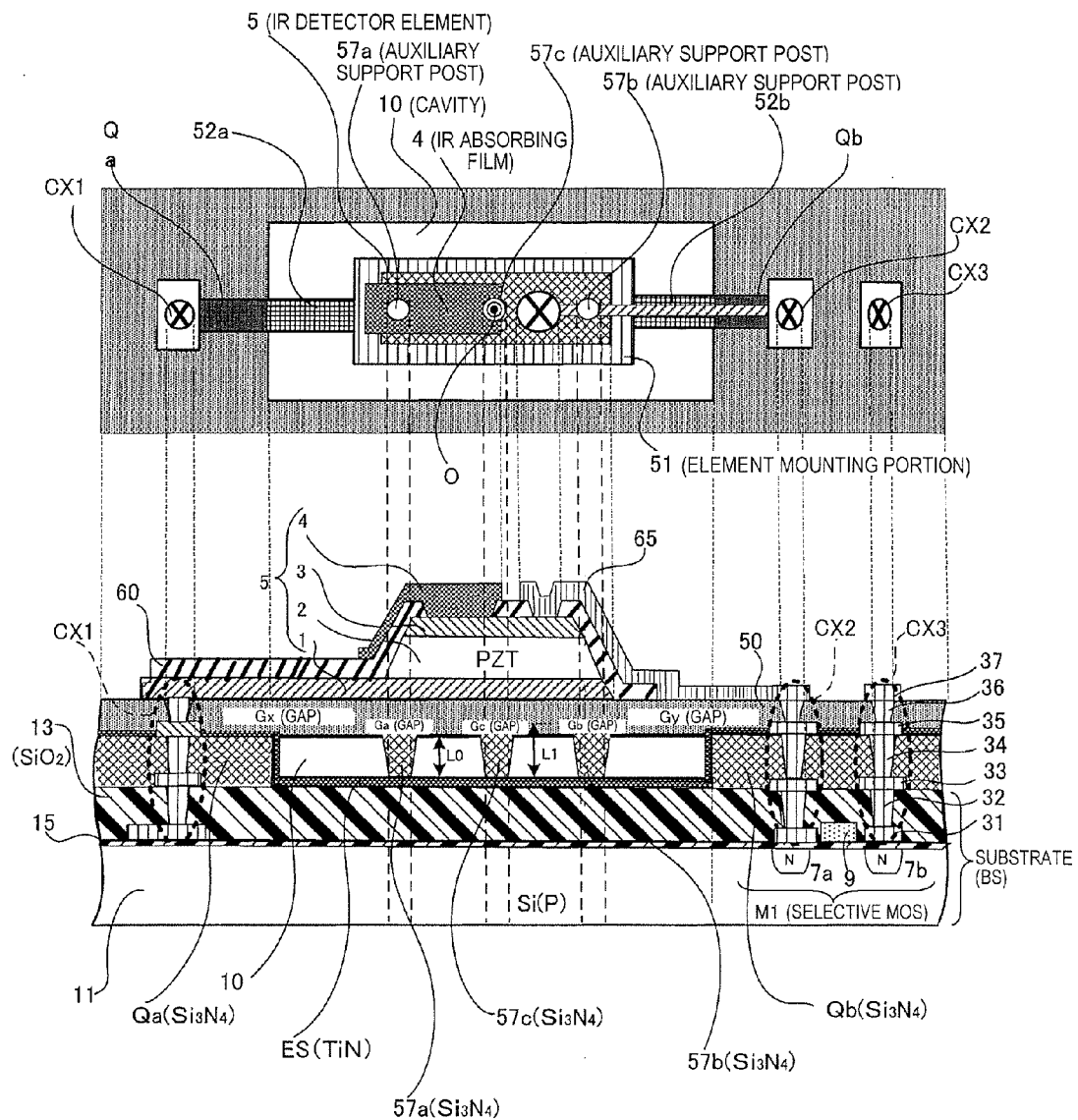
FIG. 12 is a drawing showing another example of a thermal detector (an example of a circuit element such as a transistor formed on a substrate)

In the step of FIG. 2A, for example, a first sacrificial layer (e.g., an $SiO_2$ layer) 70 and a stacked film 54 of $SiO_2/Si_3N_4$ film/TiN film are formed contiguously with one another on a silicon substrate (however, the material is not limited to silicon) 11 (a specific example of film configuration is shown in FIG. 12). The TiN film functions as an etching stopper during removal of the first sacrificial layer 70, and as an etching stopper during patterning of the support member 50. The first sacrificial layer (e.g., an $SiO_2$ layer) 70 is used in order to form a cavity for thermal separation purposes.

Here, the term "substrate" can be used in a narrow sense to refer to the silicon substrate 11; or in a broader sense (particularly when describing the manufacturing process), substrate may refer to the structure including the $SiO_2/Si_3N_4$ film/TiN film 55 formed on the silicon substrate (the base serving as a foundation for supporting the support member 50: sensor base). In the example of FIG. 2, the structure including the $SiO_2/Si_3N_4$ film/TiN film formed on the silicon substrate 11 is termed the substrate BS (substrate in a broad sense).

The support member 50 (membrane) is formed on the substrate BS. The support member 50 includes a first member 41, and second member 45, and a third member 43 composed, for example, of $Si_3N_4$ film; and a second sacrificial layer 80 composed of polysilicon (Poly-Si). As noted, the support member 50 includes the first arm 52a, the second arm 52b, and the mounting portion 51. The second sacrificial layer 80 composed of polysilicon (Poly-Si) is provided only in the first arm 52a and the second arm 52b. An infrared detector element 5 is formed on the mounting portion 51 (in FIG. 2, the layer serving as the light absorbing film is omitted).

In the step of FIG. 2B, the first sacrificial layer (e.g., an $SiO_2$ layer) 70 is removed using a hydrofluoric acid based etchant, for example. A cavity 10 is formed thereby between the support member 50 and the substrate BS. The cavity 10 has the function of thermally separating the support member 50 from the substrate BS.

In the step of FIG. 2C, the second sacrificial layer (Poly-Si layer) 80 is removed through dry etching, for example. By so doing, gaps G are formed in the three-dimensional structure of the first arm 52a and the second arm 52b, affording a third member 43 with reduced volume. The thermal capacity of the arm portions 52 (the first arm 52a and the second arm 52b) are reduced thereby.

Figure 3A:
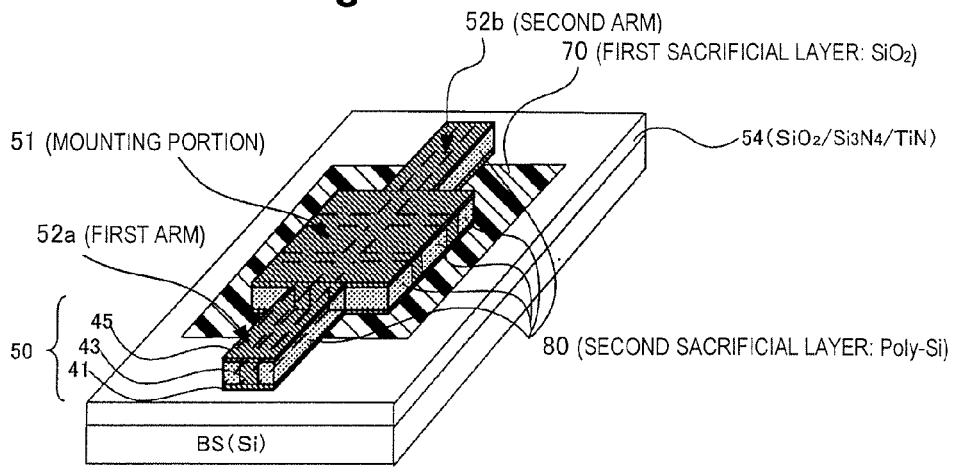
FIG. 3A to FIG. 3C are drawings illustrating an overview of another example of a method of manufacturing a thermal detector.
Figure 3B:
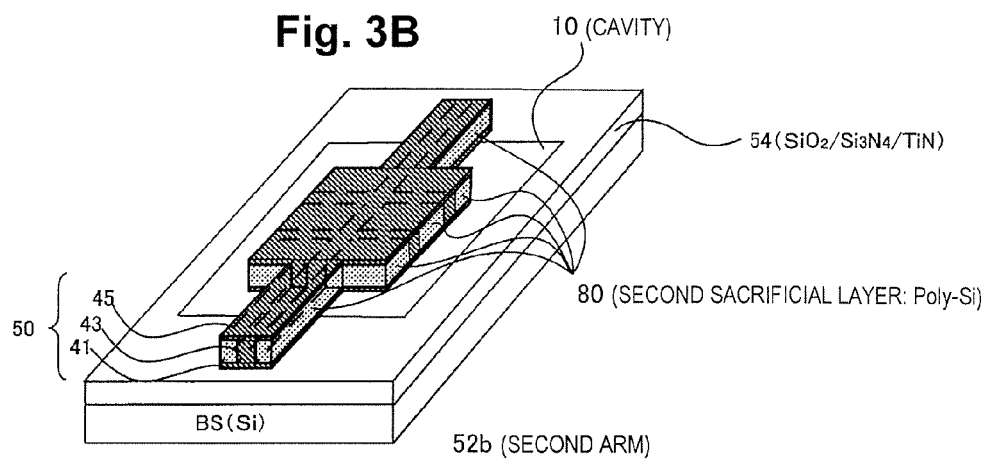
Figure 3C:
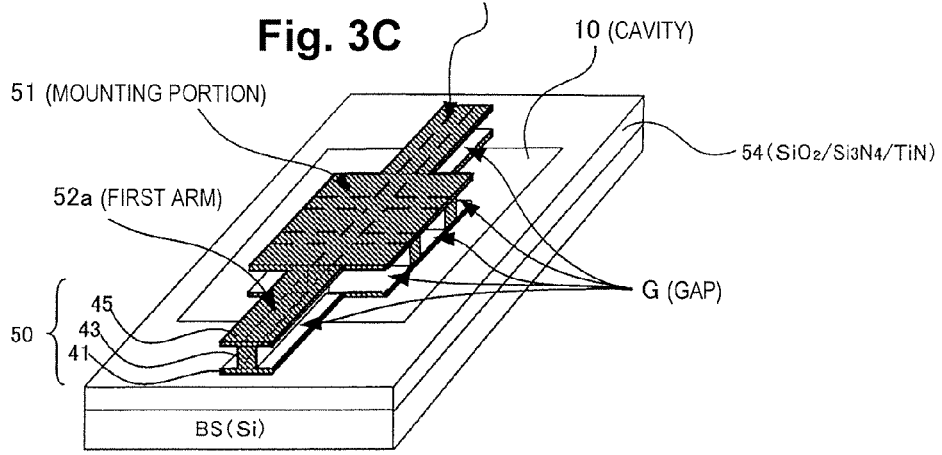

Reference is now made to FIGS. 3A to 3C. FIGS. 3A to 3C are drawings illustrating an overview of another example of a method of manufacturing a thermal detector. In the example of FIG. 3, a process to reduce the volume of the third member 43 is carried out on both the arm portions 52 and the mounting portion 51.

In the step of FIG. 3A, a first sacrificial layer (e.g., an $SiO_2$ layer) 70 and a stacked film 54 of $SiO_2/Si_3N_4$ film/TiN film are formed contiguously with one another on the silicon substrate (however, the material is not limited to silicon) 11, for example. The TiN film functions as an etching stopper during removal of the first sacrificial layer 70, and as an etching stopper during patterning of the support member 50. The first sacrificial layer (e.g., an $SiO_2$ layer) 70 is used in order to form a cavity (cavity for thermal separation purposes).

The support member 50 (membrane) is formed on the substrate BS. The support member 50 includes a first member 41, and second member 45, and a third member 43 composed, for example, of $Si_3N_4$ film; and a second sacrificial layer 80 composed of polysilicon (Poly-Si). As noted, the support member 50 includes the first arm 52a, the second arm 52b, and the mounting portion 51. The second sacrificial layer 80 is provided to each of the first arm 52a, the second arm 52b, and the mounting portion 51. An infrared detector element 5 is formed on the mounting portion 51 (in FIG. 3, the layer serving as the light absorbing film is omitted).

In the step of FIG. 3B, the first sacrificial layer (e.g., an $SiO_2$ layer) 70 is removed using a hydrofluoric acid based etchant, for example. A cavity 10 is formed thereby between the support member 50 and the substrate BS. The cavity 10 has the function of thermally separating the support member 50 from the substrate BS In the step of FIG. 3C, the second sacrificial layer (Poly-Si layer) 80 is removed through dry etching, for example. By so doing, gaps G are formed in the three-dimensional structures of the first arm 52a, the second arm 52b, and the mounting portion 51, to afford a third member 43 with reduced volume. The thermal capacity of the arm portions 52 (the first arm 52a and the second arm 52b) are thereby reduced. Consequently, thermal capacity and heat conductance in the support member 50 (in each of the first arm 52a, the second arm 52b, and the mounting portion 51) are reduced.

Example of Manufacturing Method

FIG. 4A to FIG. 4I are drawings illustrating an example of a specific method of manufacturing a thermal detector. In the step of FIG. 4A, for example, a first sacrificial layer (e.g., an $SiO_2$ layer) 70 and a stacked film 54 of $SiO_2/Si_3N_4$ film/TiN film are formed contiguously with one another on a silicon substrate 11, in the same manner as described in the step of FIG. 2A. However, the first sacrificial layer (e.g., an $SiO_2$ layer) 70 is not shown in FIG. 4A.

In the step of FIG. 4B, an $Si_3N_4$ layer 41 and a second sacrificial layer (polysilicon layer) 80 are formed. The $Si_3N_4$ layer 41 is a layer serving as a first member forming the three-dimensional structure of the support member 50.

In the step of FIG. 4C, an opening OP is formed in the second sacrificial layer (polysilicon layer) 80. In the step of FIG. 4D, the opening OP formed in the second sacrificial layer (polysilicon layer) 80 is filled with an $Si_3N_4$ layer 43. The $Si_3N_4$ layer 43 is a layer serving as a third member forming the three-dimensional structure of the support member 50. In the step of FIG. 4E, an $Si_3N_4$ layer 45 is formed. The $Si_3N_4$ layer 45 is a layer serving as a second member forming the three-dimensional structure of the support member 50. In the step of FIG. 4F, the support member 50 is patterned to process the member to a shape like that depicted in FIG. 2A for example.

In the step of FIG. 4G, a thermal detector element (here, a pyroelectric type infrared detector element) 5 is formed. The thermal detector element (pyroelectric type infrared detector element) 5 has a lower electrode 1, a ferroelectric layer (PZT layer) 2, an upper electrode 3, and a light (including infrared) absorbing layer 4.

Subsequently, as depicted in FIG. 2B, the first sacrificial layer ($SiO_2$ layer) 70 is removed to form a cavity 10 (this step is not shown in FIG. 4). Next, as shown in FIG. 4H (and in FIG. 2C), the second sacrificial layer (Poly-Si layer) 80 is removed through dry etching, for example. By so doing, gaps G are formed in the three-dimensional structures of the first arm 52a and the second arm 52b, to afford a third member 43 with reduced volume. Consequently, thermal capacity and heat conductance of the arm portions 52 (the first arm 52a and the second arm 52b) are reduced.

FIG. 4I shows an example of preferred dimensions for transverse cross-sectional shape in the arm portions 52 (the first arm 52a and the second arm 52b). The arm portions 52 have both longitudinal dimensions and transverse dimensions of 3 μm. The thickness of the first member 41 is 0.5 μm, and the thickness of the second member 45 is 0.5 μm as well. The height of the third member is 2 μm, and the transverse width is 1 μm. The third member 43 conjoins with the center sections of the first member 41 and the second member 45, giving a three-dimensional structure having vertical and lateral balance. Consequently, strength is improved.

Second Embodiment

FIG. 5 is a drawing showing a modified example of a transverse cross-sectional shape of a support member. In the example of FIG. 5, in the three-dimensional shape of the transverse cross-section of the support member 50, the second sacrificial layer has not been completely removed and a portion still remains. This remaining portion of the second sacrificial layer is denoted by reference symbol 80' in FIG. 5. The second sacrificial layer 80' functions as a reinforcing member. Due to the remaining second sacrificial layer 80', for example, the surface area of the section supporting the third member 45 is larger, and the mechanical strength of the H-type structure is enhanced.

Third Embodiment

In the present embodiment, in addition to the aforementioned structure for reducing the thermal capacity of the support member 50 per se, supporting support posts are utilized in order to reduce flexion of the support member and avoid problems such as sticking. Where the support member 50 is made thinner in order to reduce the thermal capacity, during the manufacturing process if, for example, wet etching is used to form the cavity for thermal separation purposes, there arises a susceptibility to sticking (adhesion (bonding)) between the substrate and the support member. Sticking can arise, for example, from surface tension of the liquid during the drying process subsequent to wet etching.

In order to avoid sticking, it is preferable to provide auxiliary support posts for stable support of the support member during the manufacturing process; however, where auxiliary support posts are simply provided, these will function as pathways for heat transmission, and therefore thermal capacity and heat conductance will increase.

Accordingly, during manufacture, it is preferable to support the support member with the auxiliary support posts until steps that could pose problems have been completed, and to then separate the auxiliary support posts from the support member so as to prevent escape of heat. For example, where the total projecting length of the auxiliary support posts is designated L0 and the maximum distance between the substrate and the support member is designated L1 (L1>L0), a third sacrificial layer is formed in the section corresponding to the differential of L1 and L0. Then, once steps that could pose problems have been completed, the auxiliary support posts and the support member 50 can be separated by removing the sacrificial layer.

As the third sacrificial layer there may be used, for example, a material identical to the constituent material of the second sacrificial layer 80 (polysilicon or the like) which is formed in order to reduce the thermal capacity of the support member 50. In this case, after removing the first sacrificial layer 70 and forming the cavity 10, by then removing the second sacrificial layer and the third sacrificial layer in the same step, for example, it is possible to achieve both reduced thermal capacity of the support member 50 and thermal separation of the auxiliary support posts and (the bottom portion) of the substrate.

The following description makes reference to FIG. 6A to FIG. 6E. FIG. 6A to FIG. 6E are drawings illustrating a configuration of an example of a thermal detector (here, a pyroelectric type infrared detector) having auxiliary support posts. FIG. 6A is a plan view of principal portions of the thermal detector; FIG. 6B is a cross-sectional view taken along line A-A in FIG. 6A; and FIG. 6C to FIG. 6E are respective drawings showing configuration examples of an auxiliary support post. The thermal detector shown in FIG. 6A and FIG. 6B is a pyroelectric type infrared detector (pyroelectric type infrared sensor) having a three-dimensional structure formed on a substrate using MEMS (Micro-Electrical-Mechanical Systems) technology (a semiconductor manufacturing technology). An etching stopper film ES (TiN film) is disposed on the surface of the substrate BS.

The pyroelectric type infrared detector (pyroelectric type photodetector element) 5 provided as the thermal detector element has a lower electrode 1, a pyroelectric film (ferroelectric film) 2, an upper electrode 3, and an infrared absorbing film 4 provided as the light absorbing film. The lower electrode (first electrode) 1 and the upper electrode (second electrode) 3 are formed through successive deposition of three layers of metal film, for example. These may have a three layer structure composed, in order from the location furthest away from the pyroelectric film (ferroelectric film) 2, of an iridium (Ir) layer formed by sputtering, for example; an iridium oxide (IrOx) layer; and a platina (Pt) layer, for example. PZT ($Pb(Zi, Ti)O_3$: lead zirconate titanate) may be used for the pyroelectric film (ferroelectric film) 2, for example. The pyroelectric film (ferroelectric film) 2 may be grown by a sputtering process or MOCVD process, for example. The lower electrode (first electrode) 1 and the upper electrode (second electrode) 3 have a film thickness of about 0.4 μm, for example, while the pyroelectric film (ferroelectric film) 2 has a film thickness of about 0.1 μm, for example.

As shown in FIG. 6A and FIG. 6B, in the present embodiment, in addition to main support posts (principal support posts, principal posts, or principal supporting portions) 55a, 55b, there are provided auxiliary support posts (auxiliary posts or auxiliary supporting portions) 57a, 57b for the purpose of inhibiting displacement and deformation of the support member 50 during manufacture (for the purpose of enhancing mechanical strength during manufacture).

As shown in FIG. 6A, the main support post 55a and the auxiliary support post 57a are disposed at locations overlapping the first arm 52a in plan view in the support member 50, and likewise, the main support post 55b and the auxiliary support post 57b are disposed at locations overlapping the second arm 52b in plan view. A total of four support posts (posts) are provided, with the two support posts 55a, 55b at locations further away from the infrared detector element 5 being called main support posts, and the two support posts 55a, 55b at locations closer to the infrared detector element 5 being called auxiliary support posts.

As shown in FIG. 6B, the main support posts 55a, 55b are disposed between the substrate BS, and the first arm 52a or the second arm 52b of the support member 50. At their upper faces, the main support posts 55a, 55b respectively contact the bottom faces of the first arm 52a and the second arm 52 to support the support member 50 (i.e., the first arm 52a and the second arm 52) as well as inhibiting flexion of the support member 50 (and particularly of the mounting portion 51) towards the substrate direction.

Meanwhile, the auxiliary support posts 57a, 57b are used to support the support member 50 and inhibit the occurrence of flexion and the like during (a period of) the manufacturing process. Then, once manufacturing steps that can pose problems (such as the wet etching step to form the cavity 10, in which sticking is prone to occur) have been completed, the posts are separated (disjoined) from the support member 50 by gaps Ga, Gb. Specifically, the auxiliary support posts 57a, 57b are thermally separated from the support member 50.

For example, by forming a sacrificial layer composed of a sacrificial film (where the sacrificial layer is patterned into posts, these can be called sacrificial support posts (sacrificial spacers)) conjoined with the auxiliary support posts 57a, 57b, the support member 50 can be supported by the auxiliary support posts (57a, 57b) and the sacrificial layer (sacrificial support posts). By so doing, the mechanical strength of the support member 50 may be substantially improved. Consequently, sticking may be inhibited during the drying process subsequent to the wet etching step or the like.

The gaps Ga, Gb are formed between the support member and the auxiliary support posts through removal of the sacrificial layer (sacrificial support posts), which is no longer needed once manufacturing steps that can pose problems have been completed. Specifically, with the thermal detector in the completed state, where the maximum distance between the support member 50 and the substrate BS is designated as L1 and the total projecting length of the auxiliary support posts 57a, 57b is designated as L0, there exists the relationship: L1>L0. The gaps Ga, Gb having clearance corresponding to the differential of L1 and L0 are then formed, thereby thermally separating the support member 50 and the auxiliary support posts 57a, 57b. Therefore, after manufacture of the thermal detector element has been completed, the presence of the auxiliary support posts has no effect on diffusion of heat via the support member 50. Consequently, it is possible to both reduce the thermal capacity of the support member which supports the thermal detector element, and to ensure the necessary mechanical strength during the manufacturing steps.

It is not always necessary to provide the main support posts 55a, 55b. For example, if the distances of the first arm 52a and the second arm 52b are short, in some instances the first arm 52a and the second arm 52b may be supported simply by fastening portions Qa, Qb situated on the substrate BS side.

Possible modes of forming the auxiliary support posts include those depicted in FIG. 6C to FIG. 6E. In the example of FIG. 6C, the auxiliary support post 57 projects towards the support member 50 from the substrate BS, with a gap (air gap) G disposed on the support member 50 side. In the structure depicted in FIGS. 6A and 6B, auxiliary support posts of the mode of FIG. 6C are used.

In the example of FIG. 6D, the auxiliary support post 57 projects towards the substrate BS from the support member 50, with a gap G disposed on the substrate BS side. In the example of FIG. 6E, a pair of auxiliary support posts 57 are provided. One of the pair of auxiliary support posts 57 projects towards the support member 50 from the substrate BS, the projection length thereof being denoted as La; while the other projects towards the substrate BS from the support member 50, the projection length thereof being denoted as Lb. A gap G is formed at a location between the pair of auxiliary support posts 57. Where the total projecting length of the auxiliary support posts 57 is designated as L0 (=La+Lb) and the maximum distance between the support member 50 and the substrate BS is designated as L1, there exists the relationship: L1>L0.

The one or more auxiliary support posts (57a, 57b, etc.) may be disposed between the substrate BS and the mounting portions 51 which is a constituent element of the support member 50 and/or between the one or more arm portions (the first arm 52a, the second arm 52b) and the substrate BS, as seen in cross section. Specifically, the auxiliary support posts (57a, 57b, etc.) may be disposed at locations having overlap (i.e., so as to have overlap) with the mounting portion 51, or disposed at locations having overlap (i.e., so as to have overlap) with the one or more arm portions (the first arm 52a, the second arm 52b), as seen in plan view.

Figure 7A:
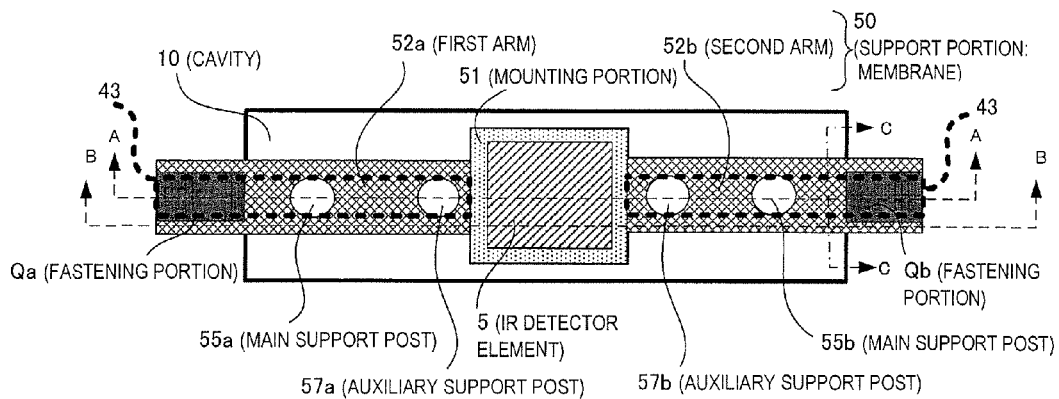
FIG. 7A to FIG. 7C are drawings illustrating an example of a three dimensional structure of a thermal detector having auxiliary support posts, and reduced thermal capacity of the support member.
Figure 7B:
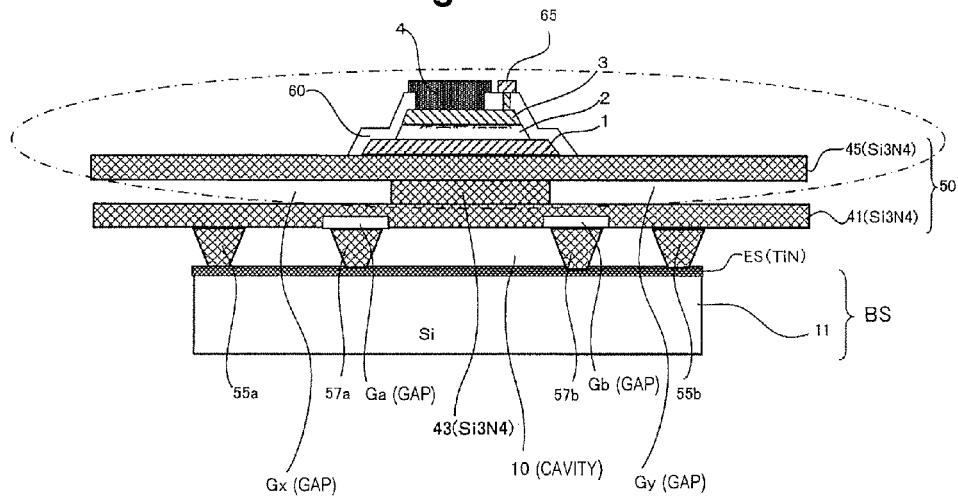
Figure 7C:
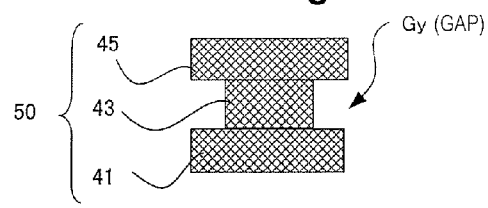

Example of Three-Dimensional Structure of Thermal detector having Auxiliary Support Posts and Reduced Thermal Capacity of Support Member, and Method of Manufacture Thereof The following description makes reference to FIG. 7A to FIG. 7C. FIG. 7A to FIG. 7C are drawings illustrating an example of a three dimensional structure of a thermal detector having auxiliary support posts and reduced thermal capacity of the support member. FIG. 7A is a plan view. FIG. 7B is a drawing depicting a combination of a cross-sectional view taken along line A-A of FIG. 7A (the cross-sectional structure of a section located below the section encircled by the single-dot and dash line), and a cross-sectional view taken along line B-B (the cross-sectional structure of the section encircled by the single-dot and dash line). Specifically, both the structure of auxiliary support posts and the structure of third members having undergone processing to reduce the thermal capacity are depicted in cross-sectional views taken along different lines of section and shown synthesized, as they cannot be shown in cross cross-sectional views taken along the same line of section. FIG. 7C is a cross-sectional view taken along line C-C of FIG. 7A.

In FIG. 7A, heavy single-dot and dash lines denote the planar shapes of the third members 43 in the arm portions 52, which have undergone processing to reduce thermal capacity.

As shown in FIG. 7B, a cavity 10 for thermal separation purposes is formed between the substrate BS and the support member 50. Each of the auxiliary support posts 57a, 57b is separated from the support member 50 by the respective gaps Ga and Gb. In the arm portions 52 (the first arm portion 52a, the second arm portion 52b), the third members 43 have been partially removed, reducing the volume of the third members.

As shown in FIG. 7C, the three-dimensional structure of the transverse cross-section of the arm portions 52 (the first arm portion 52a, the second arm portion 52b) has an H-type structure.

The following description of a manufacturing method makes reference to FIGS. 8A to 8D, FIGS. 9A to 9C, FIGS. 10A and 10B, and FIGS. 11A and 11B. FIGS. 8A to 8D, FIGS. 9A to 9C, FIGS. 10A and 10B, and FIGS. 11A and 11B are all drawings illustrating an example of a method of manufacturing a three dimensional structure of a thermal detector having auxiliary support posts and reduced thermal capacity of the support member.

Figure 8A:
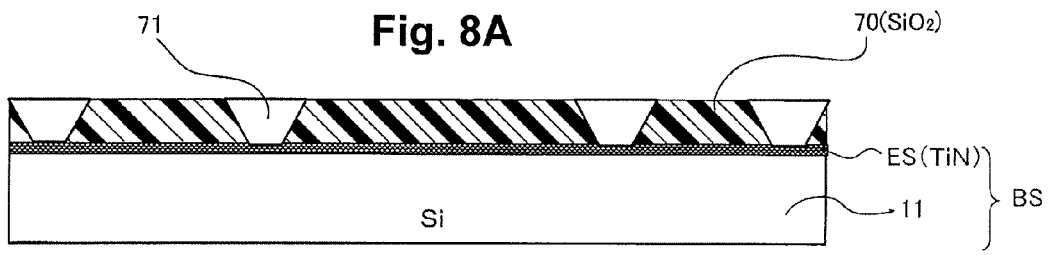
FIG. 8A to FIG. 8D are drawings illustrating an example of a method of manufacturing a three dimensional structure of a thermal detector having auxiliary support posts, and reduced thermal capacity of the support member.

Step 1 (FIG. 8A)

In the case of forming the thermal detector depicted in FIGS. 7A to 7C, first, a portion of a silicon substrate 11 undergoes an etching process to form a recessed portion, and the surface of the recessed portion is covered with an etching stopper film ES (TiN). Next, as shown in FIG. 8A, a first sacrificial layer ($SiO_2$ layer) 70 is formed over the substrate BS so as to fill (pack) a space that is to define the cavity 10. Next, the first sacrificial layer ($SiO_2$ layer) 70 is patterned to produce openings 71 at locations where the main support posts and auxiliary support posts are to be formed.

Figure 8B:
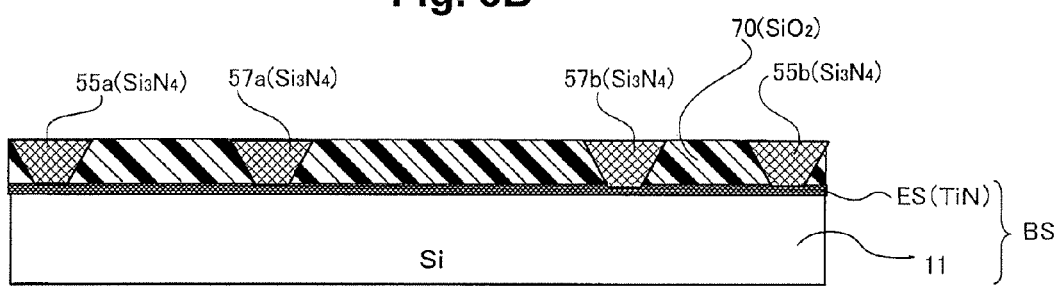

Step 2 (FIG. 8B)

Next, as shown in FIG. 8B, the openings 71 are filled with a silicon nitride layer ($Si_3N_4$ layer) providing the main support post layers 55a, 55b and the auxiliary support post layers 57a, 57b. Specifically, for example, after forming a silicon nitride layer ($Si_3N_4$ layer) over the entire face, the silicon nitride layer ($Si_3N_4$ layer) overlying the first sacrificial layer 70 is removed by an etch-back process, whereby the openings 71 are filled with a silicon nitride layer ($Si_3N_4$ layer) serving as the main support post layers and the auxiliary support post layers. That is, the auxiliary support posts 57a, 57b may be formed through infill of auxiliary support post layers into the openings 71 which are selectively provided in the first sacrificial layer 70. According to this method, the auxiliary support posts 57a, 57b may be formed in a reasonable manner utilizing a semiconductor manufacturing method (photolithography).

Figure 8C:
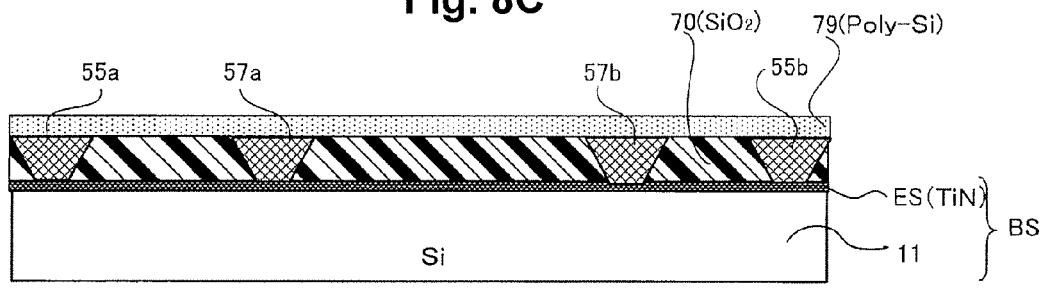
Figure 8D:
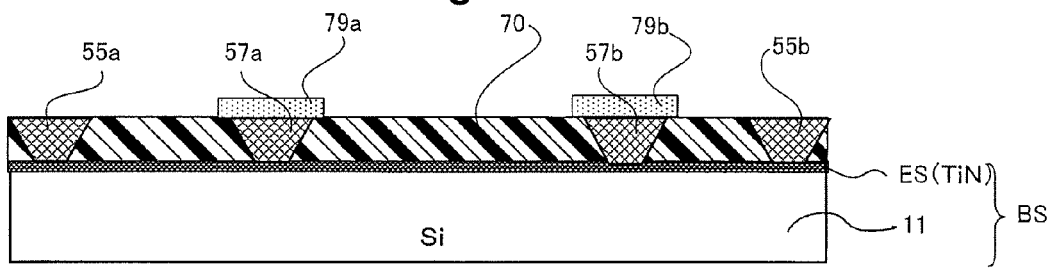

Step 3, Step 4 (FIG. 8C, FIG. 8D)

Next, as shown in FIG. 8C, a third sacrificial layer (Poly-Si layer) 79 is formed. Next, as shown in FIG. 8D, the third sacrificial layer (Poly-Si layer) 79 is patterned to form third sacrificial layers (Poly-Si layers) 79a, 79b provided as sacrificial support posts (sacrificial spacers).

Figure 9A:
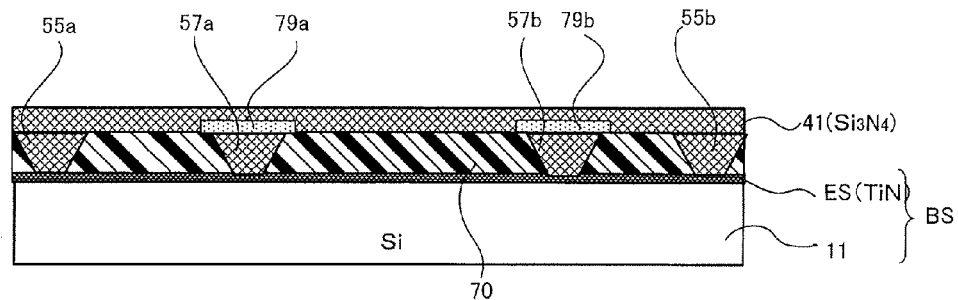
FIG. 9A to FIG. 9C are drawings illustrating an example of a method of manufacturing a three dimensional structure of a thermal detector having auxiliary support posts, and reduced thermal capacity of the support member.

Step 5 (FIG. 9A)

Next, as shown in FIG. 9A, a silicon nitride film ($Si_3N_4$ film) 41 provided as the first member is formed as one of the constituent films of the support member 50.

Figure 9B:
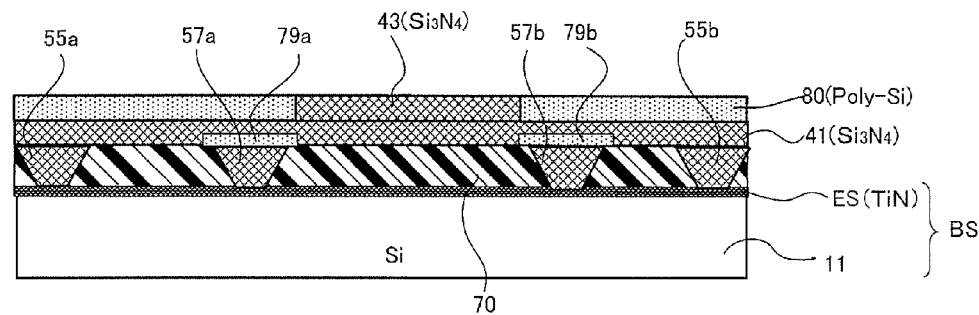

Step 6 (FIG. 9B)

Next, as shown in FIG. 9B, after forming a polysilicon layer (Poly-Si layer) 80 as a second sacrificial layer, the layer is patterned to produce an opening, and the opening is filled with a silicon nitride film ($Si_3N_4$ film) 43 provided as the third member which is one of the constituent films of the support member 50.

Figure 9C:
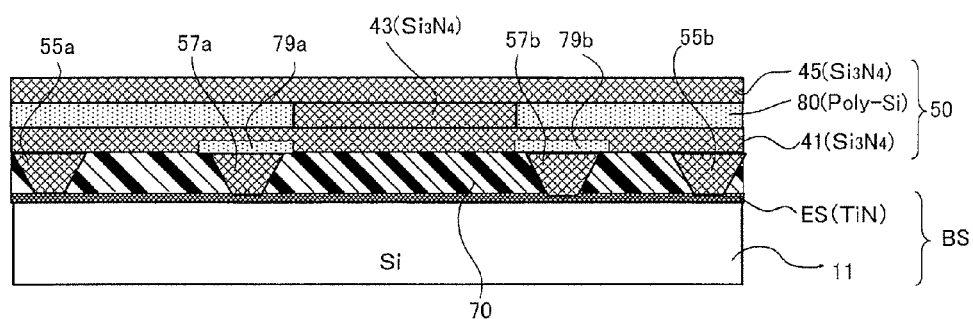

Step 7 (FIG. 9C)

Next, a silicon nitride film ($Si_3N_4$ film) 45 provided as the second member is formed as one of the constituent films of the support member 50. The support member (membrane) 50 is composed of these layered films (however, the polysilicon layer (Poly-Si layer) 80 provided as the second sacrificial layer is subsequently removed).

Figure 10A:
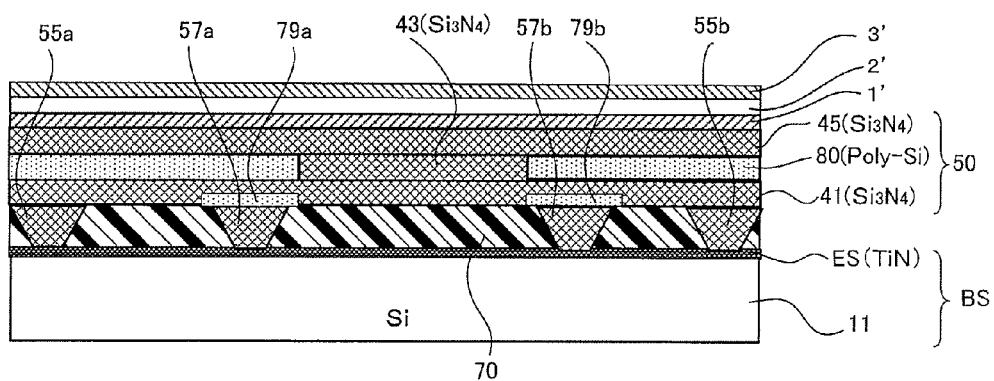
FIG. 10A and FIG. 10B are drawings illustrating an example of a method of manufacturing a three dimensional structure of a thermal detector having auxiliary support posts, and reduced thermal capacity of the support member.

Step 8 (FIG. 10A)

Next, as shown in FIG. 10A, a lower electrode constituent material layer 1', a ferroelectric layer (PZT layer) 2', and an upper electrode constituent material layer 3' are sequentially layered. The lower electrode constituent material layer 1' and the upper electrode constituent material layer 3' may each have a three layer structure composed, in order from the location furthest away from the ferroelectric layer 2', of an iridium (Ir) layer, an iridium oxide (IrOx) layer, and a platina (Pt) layer, for example. PZT (Pb(Zi, Ti)O$_3$: lead zirconate titanate) may be used for the ferroelectric layer 2'. These films may be grown by a sputtering process or MOCVD process, for example. The lower electrode constituent material layer 1' and the upper electrode constituent material layer 3' have film thicknesses of about 0.4 μm, for example, while the ferroelectric layer 2' has a film thickness of about 0.1 μm, for example.

Figure 10B:
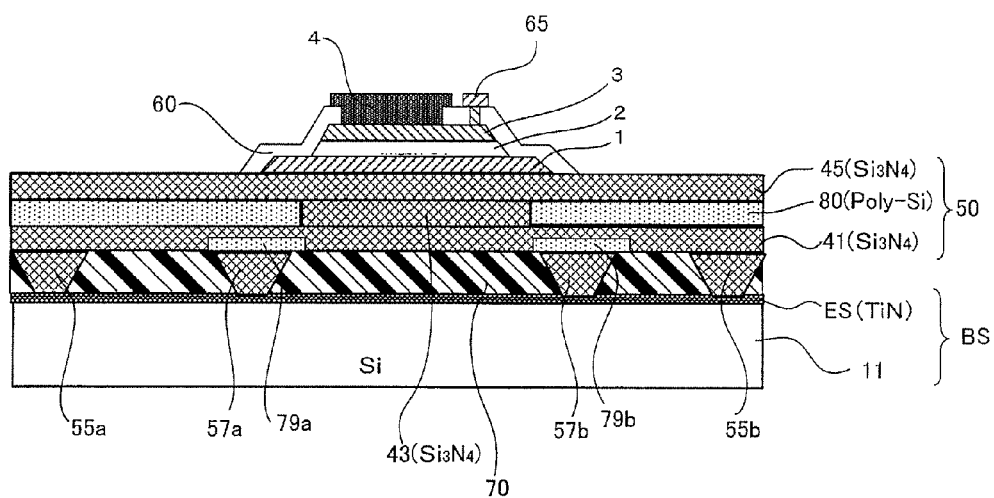

Step 9 (FIG. 10B)

Next, as shown in FIG. 10B, the lower electrode constituent material layer 1', the ferroelectric layer (PZT layer) 2', and the upper electrode constituent material layer 3' are each patterned to produce an upper electrode 1, a ferroelectric film (PZT film) 2, and a lower electrode 3 (thereby forming a layered capacitor). Next, the top of the layered capacitor is covered by an electrically insulating film 60. Next, a light absorbing film (infrared absorbing film) 4 and an extraction electrode layer 65 are formed. The light absorbing film (infrared absorbing film) 4 may be an SiO$_2$ film for example.

Figure 11A:
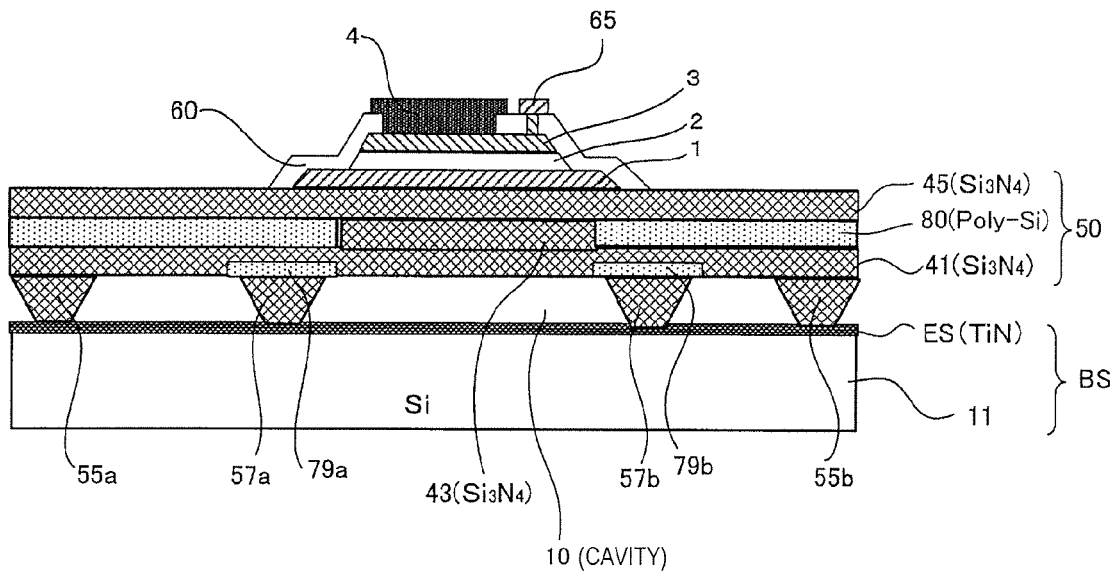
FIG. 11A and FIG. 11B are drawings illustrating an example of a method of manufacturing a three dimensional structure of a thermal detector having auxiliary support posts, and reduced thermal capacity of the support member.

Step 10 (FIG. 11A)

Next, as shown in FIG. 11A, the first sacrificial layer (SiO$_2$ layer) 70 is removed using a hydrofluoric acid based etchant, for example. A cavity 10 is formed thereby between the substrate BS and the support member 50. This cavity 10 has the function of thermally separating the support member 50 from the substrate. During this time, the support member 50 is provided with stable support by the main support posts 55a, 55b and the auxiliary support posts 57a, 57b, thereby inhibiting displacement and deformation, and making sticking unlikely to occur.

During removal by etching of the first sacrificial layer (SiO$_2$ layer) 70, because the constituent materials of the main support posts 55a, 55b, the auxiliary support posts 57a, 57b, and the second sacrificial layer 80 differ therefrom, these are left without being removed. Moreover, because an etching stopper film ES (TiN film) is formed on the surface of the silicon substrate 11, and the front and back faces of the support member (membrane) 50 are Si$_3$N$_4$ films, these are left without being removed as well.

Figure 11B:
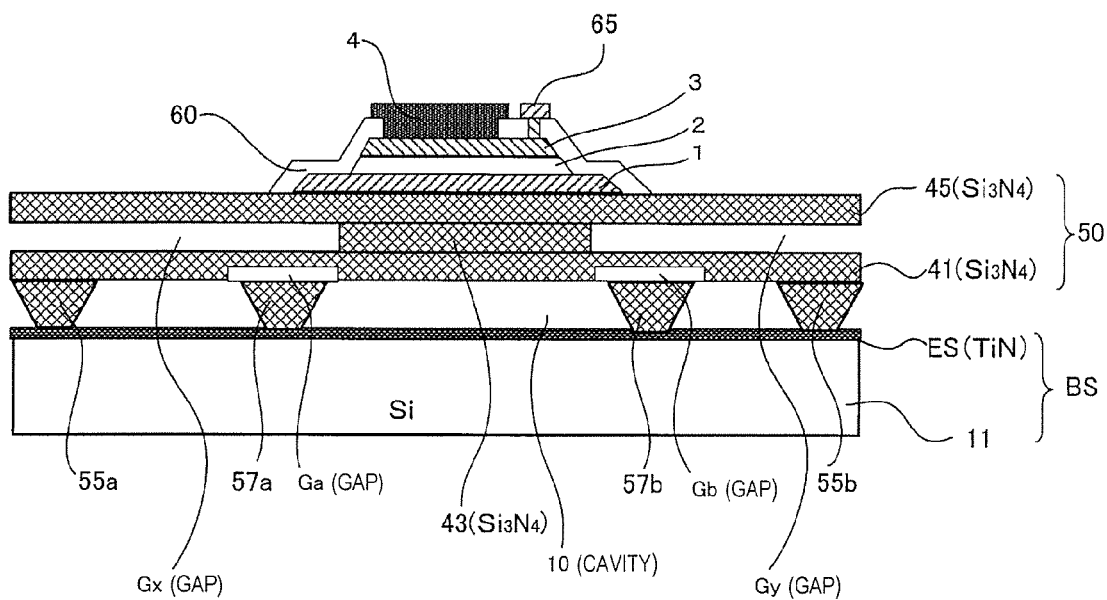

Step 11 (FIG. 11B)

Next, as shown in FIG. 11B, the second sacrificial layers (Poly-Si sacrificial support posts (sacrificial spacers)) 79a, 79b and the third sacrificial layer (Poly-Si layer) 80 are removed through dry etching, for example. Gaps Ga, Gb for separating the auxiliary support posts 79a, 79b from the support member 50 are formed thereby, and gaps Gx, Gy for minimizing the thermal capacity of the support member 50 are formed at the same time.

In preferred practice, etching of the polysilicon layers 79, 80 is carried out by dry etching (e.g., plasma dry etching using an XeF$_2$ based etching gas), in order to prevent sticking. While concomitant use of wet etching and dry etching is possible as well, in this case, it is preferable to use dry etching for the final etching. According to this method, the gaps Ga, Gb for thermal separation purposes and the gaps Gx, Gy for reducing the thermal capacity of the support member 50 may be formed in a reasonable manner utilizing a semiconductor manufacturing method (photolithography).

By placing the thermal detector element in a hermetically sealed package, for example, the heat separation function of the gaps Ga, Gb is enhanced. Forming the gaps Ga, Gb has the effect of interrupting the heat dissipation path via the auxiliary support posts 57a, 57b. Thus, the presence of the auxiliary support posts 57a, 57b has no effect on the thermal capacity or heat conductance of the support member. In this way, a thermal detector (an infrared detector or the like) is formed. Because this thermal detector (infrared detector or the like) is manufactured using semiconductor manufacturing technology, miniaturization (scale reduction) is possible; and because the auxiliary support posts (auxiliary posts) are thermally separated from the support member by gaps, there is no decline in the characteristics of the element; and problems such as sticking are unlikely to occur during the manufacturing process, thereby affording manufacture with good yield.

Moreover, the volume of the third member 43, which is a constituent film of the support member 50, can be smaller by the equivalent of the gaps Gx, Gy (the gaps formed through removal of the polysilicon layer 80 provided as the second sacrificial layer). By so doing, the thermal capacity and heat conductance of the support member 50 can be reduced.

Thus, according to the present embodiment, a thermal detector (an infrared detector element or the like) having low thermal capacity (i.e., high thermal sensitivity) and low heat conductance may be obtained. Additionally, thermal detectors (infrared detector elements or the like) can be manufactured with good yield (i.e., with negligible problems such as sticking during the manufacturing process).

Fourth Embodiment

FIG. 12 is a drawing showing another example of a thermal detector (an example of a circuit element such as a transistor formed on a substrate). In FIG. 12, a plan view of a thermal detector (thermal type infrared detector) is shown at the top, and a cross-sectional view is shown at the bottom. In FIG. 12, sections comparable to those in the preceding drawings are assigned like reference symbols.

In FIG. 12, on the surface of a p-type silicon substrate 11 there is formed a thin oxide film (gate oxide film) 15, and over the gate oxide film 15 there is formed a MOS transistor gate (e.g., a silicon gate) 9. The gate 9 and n-type diffusion layers 7a, 7b constitute a MOS transistor M1. This MOS transistor M1 may be utilized, for example, as a selective transistor M1 in the detector cell CL1 shown in FIG. 13.

An interlayer insulating film 13 (SiO$_2$ layer) is formed over the silicon substrate 11. The three-dimensional structure described above is formed over the interlayer insulating film 13. In the present embodiment, the section including the silicon substrate 11, the interlayer insulating film 13, and Si$_3$N$_4$ films Qa, Qb is considered as the substrate BS (base portion BS) broadly defined.

In the present embodiment, three auxiliary support posts (57a to 57c) are provided. Gaps Ga to Gc are formed between the support member 50 and each of the auxiliary support posts (57a to 57c). No main support posts are used in the present embodiment. In the example of FIG. 12, three contact portions (CX1 to CX3) are provided. Each of the contact portions (CX1 to CX3) is composed of a first metallization layer 31, a contact plug 32, a second metallization layer 32, a contact plug 34, a third metallization layer 35, a contact plug 36, and a fourth metallization layer 37.

The arm portions 52 of the support member (membrane) 50 are provided with gaps Gx, Gy for reducing the thermal capacity of the support member 50.

Fifth Embodiment

Figure 13:
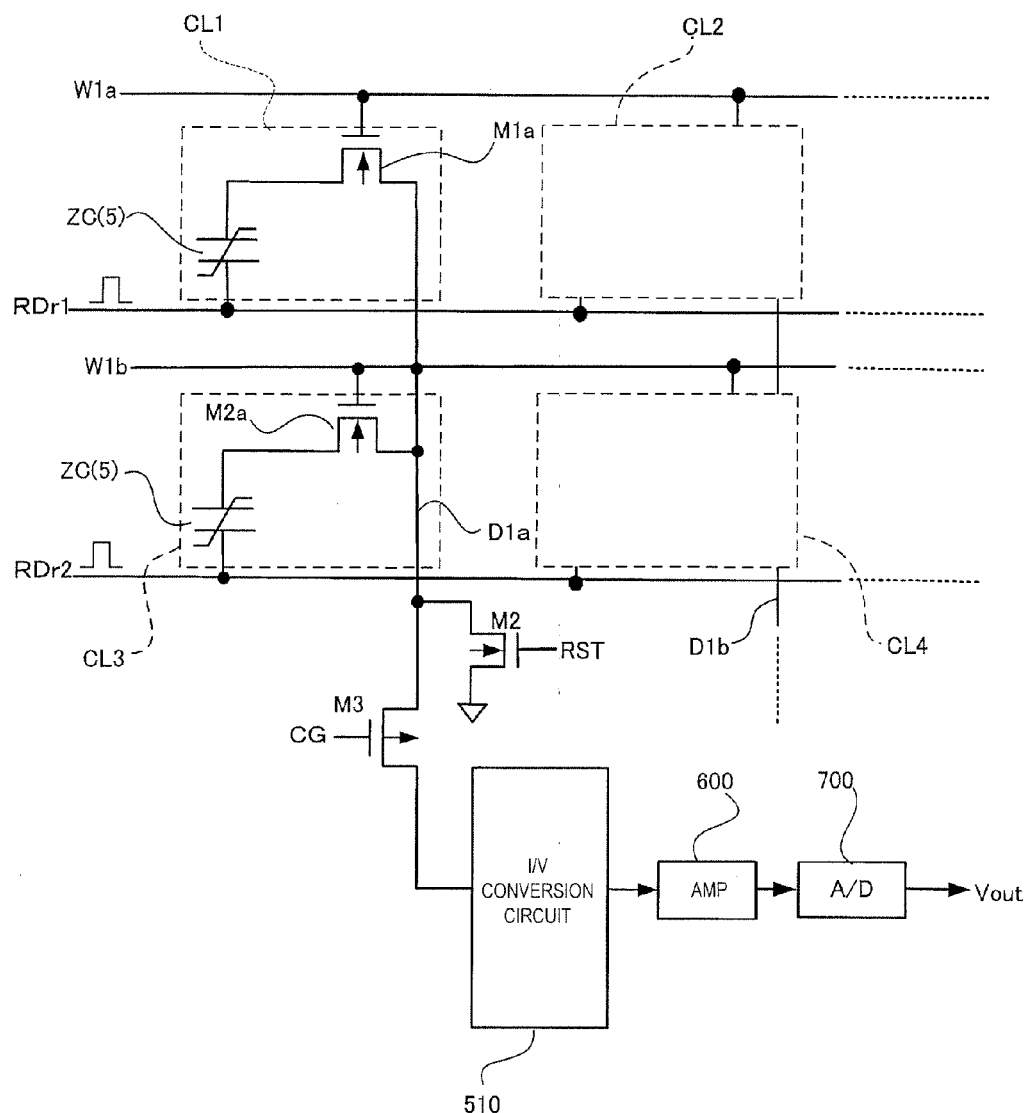
FIG. 13 is a circuit diagram showing an example of a circuit configuration of a thermal detector device (a thermal type photodetection array)

FIG. 13 is a circuit diagram showing an example of a circuit configuration of a thermal detector device (a thermal type photodetection array). In the example of FIG. 13, a plurality of detector cells (CL1 to CL4, etc.) are arranged two-dimensionally. Scan lines (W1a, W1b, etc.) and data lines (D1a, D1b, etc.) are provided for selecting single detector cells from among the plurality of detector cells (CL1 to CL4, etc.).

The detector cell CL1 has a piezoelectric capacitor ZC provided as a thermal detector element 5, and an element selection transistor M1a. The potential relationship of the two poles of the piezoelectric capacitor ZC can be inverted by switching the potential applied to PDr1 (this potential inversion eliminates the need for a mechanical chopper). The detector cell CL2 has a comparable configuration (the other detector cells also have comparable configurations).

The potential of the data line D1a can be initialized by turning on a reset transistor M2. When reading out a sensor signal, a readout transistor M3 is turned on. Electrical current produced through the pyroelectric effect is converted to voltage by an I/V conversion circuit 510, amplified by an amp 600, and then converted to digital data by an A/D converter 700.

The present embodiment affords a thermal detector device (thermal type light array sensor) in which a plurality of thermal detectors (thermal detector elements) are arranged two-dimensionally (for example, arranged in arrays along two orthogonal axes (an X axis and a Y axis)).

Sixth Embodiment

Figure 14A:
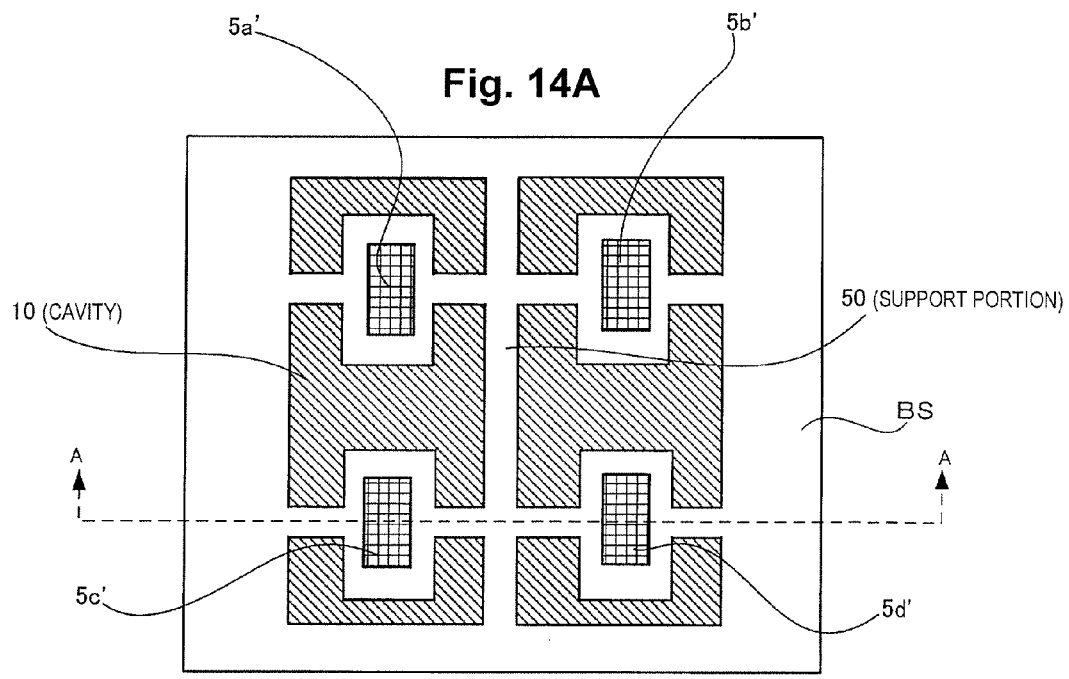
FIG. 14A and FIG. 14B are drawings illustrating an example of a bolometer having auxiliary support posts.
Figure 14B:
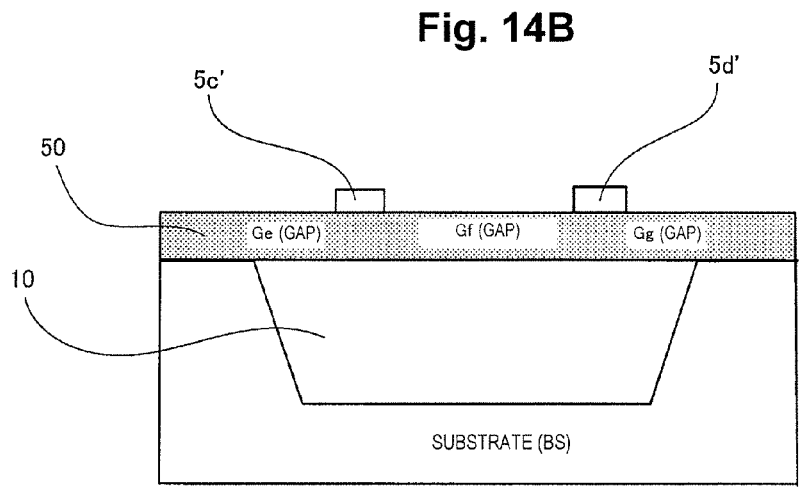

FIG. 14A and FIG. 14B are drawings illustrating an example of a bolometer having auxiliary support posts. FIG. 14A is a plan view, and FIG. 14B is a cross-sectional view taken along line A-A. The bolometer of the present embodiment is a bolometer that uses a thermosensitive resistance element, for example.

As shown in FIG. 14A and FIG. 14B, a cavity 10 for thermal separation purposes is formed in the substrate BS. The support member 50 is spaced apart from the substrate BS across this cavity 10. Four mounting portions 51a to 51d are provided to the support member 50. Four thermosensitive resistance elements (SiC thin film thermistors or the like) 5a' to 5d' are respectively mounted on the mounting portions 51a to 51d. The thermosensitive resistance elements 5a' to 5d' are connected to one another by a bridge circuit, for example.

The support member 50 is provided with gaps Ge, Gf, Gg which reduce the thermal capacity of the support member 50.

Seventh Embodiment

Figure 15:
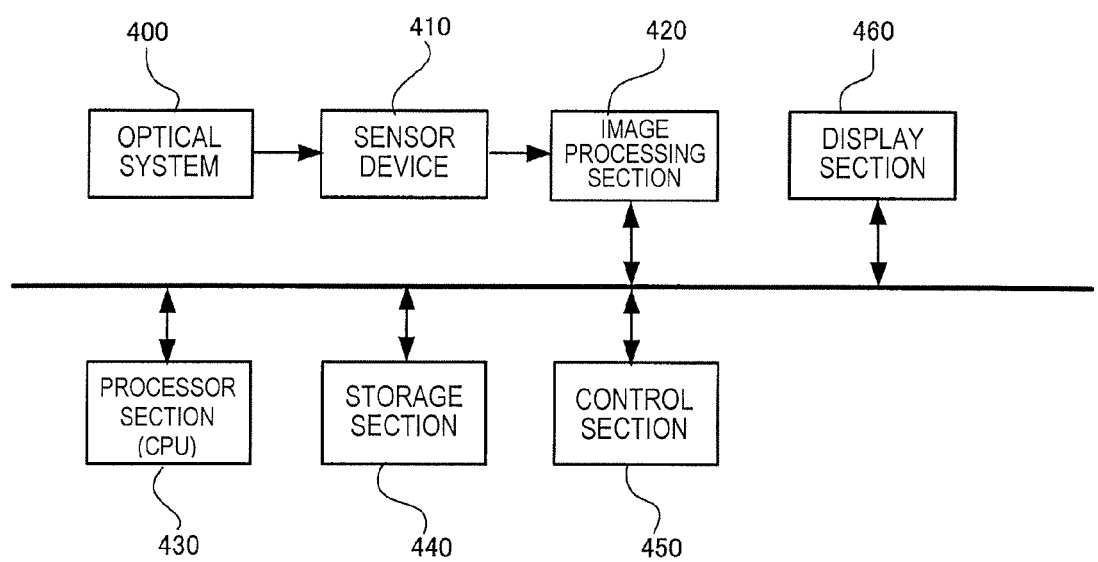
FIG. 15 is a block diagram depicting an example of a configuration of an electronic instrument including a thermal detector or thermal detector device.

FIG. 15 depicts a configuration example of an electronic instrument including the thermal detector or thermal detector device of the present embodiment. The electronic instrument is an infrared camera, for example. As illustrated, the electronic instrument includes an optical system 400, a sensor device (thermal detector device) 410, an image processing section 420, a processor section 430, a storage section 440, a control section 450, and a display section 460. The electronic instrument of the present embodiment is not limited to the configuration of FIG. 15, and various other modified embodiments in which some of the constituent elements thereof (e.g., the optical system, the control section, the display section, and so on) are omitted, or other constituent elements are added, are also possible.

The optical system 400 includes, for example, one or several lenses, a drive section for driving these lenses, and so on, and carries out formation of an object image on the sensor device (thermal detector device) 410, etc. The system may also carry out focus adjustment if needed.

The sensor device 410 is composed of detectors according to the preceding present embodiment in a two-dimensional arrangement, and is furnished with a plurality of row lines (scan lines (or word lines)) and a plurality of column lines (data lines). In addition to the two-dimensionally arrayed detectors, the sensor device 410 may include a row select circuit (row driver), a readout circuit for reading out data from the detectors via the column lines, an A/D converter, and the like. An imaging process of an object image can be carried out by sequentially reading out data from the two-dimensionally arrayed detectors.

On the basis of digital image data (pixel data) from the sensor device 410, the image processing section 420 carries out image processing of various kinds, such as image correction processes. The processor section 430 carries out control of the electronic instrument as a whole, or control of blocks within the electronic instrument. This processor section 430 is realized using a CPU, for example. The storage section 440 is used to store information of various kinds, and functions as a work area for the processor section 430 and the image processing section 420, for example. The control section 450 is an interface allowing a user to control the electronic instrument, and may be realized, for example, through various types of buttons, GUI (graphical user interface) screens, or the like.

The display section 460 is used to display, for example, images acquired by the sensor device 410, GUI screens, and the like, and may be realized through various types of display devices such as a liquid crystal display or an organic EL display.

In this way, besides using a single cell-equivalent thermal detector device as a sensor such as an infrared sensor, the sensor device 410 may be constituted by a two-dimensional arrangement of single cell-equivalent thermal detector devices along two orthogonal axial directions, for example, whereby images of light (or temperature) distribution may be provided. Such a sensor device 410 may be utilized to build electronic instruments such as thermography systems, or vehicle-mounted night vision or monitoring cameras.

Of course, using either single cell-equivalent or multi-cell thermal detector devices as sensors, it is possible to build electronic instruments of various kinds, such as analytical systems (measurement systems) for analyzing (measuring) physical information of objects, security systems for detecting fire or heat, FA (factory automation) systems for factories, and the like.

While only selected embodiments have been chosen to illustrate the present invention, it will be readily apparent to those skilled in the art from the novel matters and effects of the present invention that numerous modifications may be made herein without substantially departing from the scope of the invention. Consequently, all modifications such as the above may be understood to fall within the scope of the invention. Terms disclosed together with different equivalent or broader terms in at least one instance in the specification or drawings, for example, may be replaced by these different terms at any place in the specification or drawings. For example, there are various possible modifications in relation to the constituent materials of the first sacrificial layer, the second sacrificial layer, and the third sacrificial layer, and to the method of removal thereof.

According to at least one embodiment of the present invention, it is possible to achieve, for example, both a reduction in thermal capacity of a support member for supporting a thermal detector element, and assured mechanical strength necessary in the manufacturing process. The problem of sticking may be inhibited, and thermal detectors may be manufactured with good yield.

The present invention has broad potential for application in various kinds of thermal detector devices (e.g., thermocouple type elements (thermopiles), pyroelectric elements, bolometers, and the like). The wavelength of the detected light is not critical.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A thermal detector comprising:
   a substrate;
   a thermal detector element including a light absorbing film; and
   a support member supported on the substrate and supporting the thermal detector element, the support member having a mounting portion for mounting the thermal detector element, and a first arm connected at one end to the mounting portion and connected at another end to the substrate,
   each of the mounting portion and the first arm having
      a first member disposed toward the substrate, a transverse width of a transverse cross-sectional shape of the first member being set to a first width,
      a second member disposed toward the thermal detector element and facing the first member, a transverse width of a transverse cross-sectional shape of the second member being set to the first width, and
      at least one third member linking the first member and the second member, a transverse width of a transverse cross-sectional shape of the at least one third member being set to a second width that is smaller than the first width,
   the third member of the mounting portion and the third member of the first arm being conjoined relative to each other and continuously extending between the mounting portion and the first arm.

2. The thermal detector according to claim 1, wherein
   a transverse cross-section of a three-dimensional structure including the first member, the second member, and the at least one third member is an H-type cross section.

3. The thermal detector according to claim 1, wherein
   the support member further has a second arm connected at one end thereof to another end of the mounting portion, and connected at another end thereof to the substrate, and the first arm and the second arm extends in the same direction,
   the second arm includes the first member, the second member, and the third member, and
   the third member in the mounting portion has
      a first section conjoined to the third member in the first arm and extending in a first direction that is the direction of extension of the first arm,
      a second section conjoined to the third member in the second arm and extending in the first direction that is coincident with the direction of extension of the second arm, and
      a third section connected to each of the first section and the second section, and extending in a second direction that is a direction perpendicular to the first direction.

4. The thermal detector according to claim 1, further comprising
   at least one auxiliary support post of convex shape protruding from either the substrate or the support member towards the other,
   the height of the at least one auxiliary support post being shorter than the maximum height from the substrate to the support member.

5. The thermal detector according to claim 1, wherein
   the thermal detector is an infrared detector element.

6. A thermal detector device comprising a plurality of the thermal detectors according to claim 1 that are disposed in a two-dimensional arrangement.

7. An electronic instrument comprising the thermal detector according to claim 1.

8. An electronic instrument comprising the thermal detector device according to claim 6.

9. A thermal detector device comprising a plurality of the thermal detectors according to claim 2 that are disposed in a two-dimensional arrangement.

10. An electronic instrument comprising the thermal detector according to claim 2.

11. An electronic instrument comprising the thermal detector device according to claim 9.

12. A thermal detector device comprising a plurality of the thermal detectors according to claim 1 that are disposed in a two-dimensional arrangement.

13. An electronic instrument comprising the thermal detector according to claim 1.

14. An electronic instrument comprising the thermal detector device according to claim 12.

15. A thermal detector device comprising a plurality of the thermal detectors according to claim 3 that are disposed in a two-dimensional arrangement.

16. An electronic instrument comprising the thermal detector according to claim 3.

17. An electronic instrument comprising the thermal detector device according to claim 15.

18. A method of manufacturing a thermal detector device having a substrate, a thermal detector element including a light absorbing film, a support member, and at least one auxiliary support post, the support member being supported on the substrate and adapted to support the thermal detector element with the support member having a mounting portion for mounting the thermal detector element, and at least one arm portion connected at one end to the mounting portion and connected at another end to the substrate, at least one of the mounting portion and the at least one arm portion having a first member disposed toward the substrate with a transverse width of a transverse cross-sectional shape of the first member being set to a first width, a second member disposed toward the thermal detector element and facing the first member with a transverse width of a transverse cross-sectional shape of the second member being set to the first width, and at least one third member linking the first member and the second member with a transverse width of a transverse cross-sectional shape of the at least one third member being set to a second width that is smaller than the first width, the at least one auxiliary support post having a convex shape and protruding from either the substrate or the support member towards the other, the method comprising:

forming a first sacrificial layer on the substrate so as to fill a space for defining a cavity between the substrate and the support member;

forming on the first sacrificial layer the support member having the first member, the second member, the third member, and a second sacrificial layer made of a material different from a material constituting the first sacrificial layer and disposed so as to fill a space contiguous with the third member and corresponding to a difference between the first width and the second width;

forming the thermal detector element on the support member;

removing the first sacrificial layer;

removing the second sacrificial layer;

forming an auxiliary support post layer as a first auxiliary support post included in the at least one auxiliary support post; and forming a third sacrificial layer, which is conjoined with the first auxiliary support post layer, is made of a material different from a material constituting each of the auxiliary support post layer and the first sacrificial layer, is made of the same material as the second sacrificial layer, and has a thickness set such that a total height equal to the sum of a height of the first auxiliary support post layer and a thickness of the third sacrificial layer reaches the maximum height between the substrate and the support member.

* * * * *